US012804983B2

(12) United States Patent
Peng et al.

(10) Patent No.: US 12,804,983 B2
(45) **Date of Patent: *Nov. 17, 2026**

(54) TRANSISTOR ISOLATION STRUCTURES

(71) Applicant: Taiwan Semiconductor Manufacturing Company, Ltd., Hsinchu (TW)

(72) Inventors: Yu-Yun Peng, Hsinchu (TW); Fu-Ting Yen, Hsinchu City (TW); Keng-Chu Lin, Ping-Tung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 298 days.

This patent is subject to a terminal disclaimer.

(21) Appl. No.: 18/409,421

(22) Filed: Jan. 10, 2024

(65) Prior Publication Data

US 2024/0145579 A1 May 2, 2024

Related U.S. Application Data

(63) Continuation of application No. 17/412,896, filed on Aug. 26, 2021, now Pat. No. 11,908,921.

(51) Int. Cl.
*H10D 64/01* (2025.01)
*H10D 30/01* (2025.01)
(Continued)

(52) U.S. Cl.
CPC ......... *H10D 64/018* (2025.01); *H10D 30/031* (2025.01); *H10D 62/116* (2025.01); *H10D 64/015* (2025.01); *H10D 64/021* (2025.01); *H10D 30/6757* (2025.01); *H10P 14/6339* (2026.01); *H10P 14/6522* (2026.01);
(Continued)

(58) Field of Classification Search
CPC .. H10D 64/018; H10D 30/031; H10D 62/116; H10D 64/015; H10D 64/021; H10P 14/6681
See application file for complete search history.

(56) References Cited

U.S. PATENT DOCUMENTS 9,093,530 B2 7/2015 Huang et al.
9,171,929 B2 10/2015 Lee et al.
(Continued)

*Primary Examiner* — Fernando L Toledo
*Assistant Examiner* — Adam S Bowen
(74) *Attorney, Agent, or Firm* — Sterne, Kessler, Goldstein & Fox P.L.L.C.

(57) ABSTRACT

The present disclosure is directed to method for the fabrication of spacer structures between source/drain (S/D) epitaxial structures and metal gate structures in nanostructure transistors. The method includes forming a fin structure with alternating first and second nanostructure elements on a substrate. The method also includes etching edge portions of the first nanostructure elements in the fin structure to form cavities. Further, depositing a spacer material on the fin structure to fill the cavities and removing a portion of the spacer material in the cavities to form an opening in the spacer material. In addition, the method includes forming S/D epitaxial structures on the substrate to abut the fin structure and the spacer material so that sidewall portions of the S/D epitaxial structures seal the opening in the spacer material to form an air gap in the spacer material.

20 Claims, 19 Drawing Sheets

(51) Int. Cl.

| | |
|---|---|
| ***H10D 62/10*** | (2025.01) |
| *H10D 30/67* | (2025.01) |
| *H10P 14/60* | (2026.01) |
| *H10P 14/69* | (2026.01) |
| *H10P 50/28* | (2026.01) |

(52) U.S. Cl.

CPC ...... *H10P 14/6532* (2026.01); *H10P 14/6538* (2026.01); *H10P 14/6681* (2026.01); *H10P 14/6687* (2026.01); *H10P 14/6905* (2026.01); *H10P 50/283* (2026.01)

(56) References Cited

U.S. PATENT DOCUMENTS

| | | | | |
|---|---|---|---|---|
| 9,214,555 | B2 | 12/2015 | Oxland et al. | |
| 9,236,267 | B2 | 1/2016 | De et al. | |
| 9,520,482 | B1 | 12/2016 | Chang et al. | |
| 9,548,303 | B2 | 1/2017 | Lee et al. | |
| 9,564,489 | B2 | 2/2017 | Yeo et al. | |
| 9,576,814 | B2 | 2/2017 | Wu et al. | |
| 9,601,342 | B2 | 3/2017 | Lee et al. | |
| 9,608,116 | B2 | 3/2017 | Ching et al. | |
| 9,954,058 | B1 | 4/2018 | Mochizuki et al. | |
| 2020/0066508 | A1 | 2/2020 | Doris et al. | |
| 2022/0069078 | A1* | 3/2022 | Yu | H10D 62/116 |
| 2023/0066230 | A1 | 3/2023 | Peng et al. | |

* cited by examiner

TRANSISTOR ISOLATION STRUCTURES

CROSS-REFERENCE TO RELATED APPLICATION

This application is a continuation application of U.S. patent application Ser. No. 17/412,896, filed on Aug. 26, 2021, titled "Transistor Isolation Structures," the entire content of which is incorporated herein by reference.

BACKGROUND

Gate-all-around (GAA) field effect transistors (GAA-FETs), such as nano-sheet or nano-wire GAA-FETs, have improved gate control over their channel regions compared to other types of FETs whose gate structure covers sidewall portions and top surfaces of semiconductor fin structures. Due to their gate-all-around geometry, GAA nano-sheet or nano-wire FETs achieve larger effective channel widths and higher drive currents.

BRIEF DESCRIPTION OF THE DRAWINGS

Aspects of the present disclosure are best understood from the following detailed description when read with the accompanying figures.

DETAILED DESCRIPTION

Figure 1:
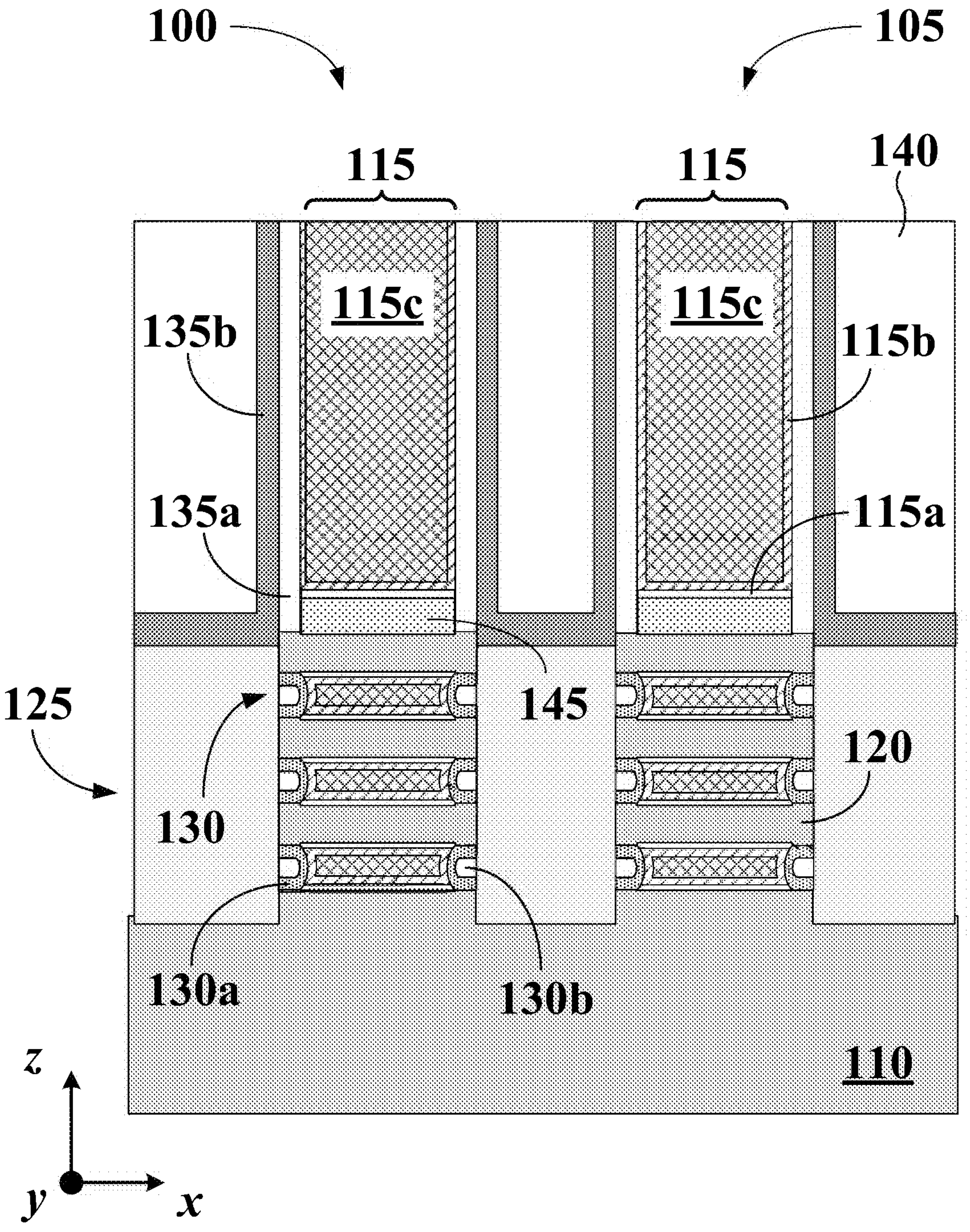
FIG. 1 is a cross-sectional view of nanostructure transistors, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

By way of example and not limitation, nanostructure transistors, like GAA nano-sheet (NS) or nano-wire (NW) FETs (collectively referred to as "GAA FETs") with nano-sheet (NS) or nano-wire (NW) channel regions, can be formed as follows. A fin-like structure with alternating silicon-germanium (SiGe) and silicon (Si) NS or NW layers is formed on a substrate (e.g., on a semiconductor substrate). A sacrificial gate structure is then formed on a middle portion of the fin-like structure to cover top and sidewall surfaces of the fin-like structure so that edge portions of the fin-like structure are not covered by the sacrificial gate structure. The edge portions of the fin-like structure not covered by the sacrificial gate structure are removed. Subsequently, edge portions of the SiGe NS or NW layers are recessed with respect to edge portions of the Si NS or NW layers to form spacer cavities, and a spacer material is deposited to fill the spacer cavities. The spacer material outside the spacer cavities is removed, for example, by an anisotropic dry etching process. Un-etched portions of the spacer material within the spacer cavity form spacer structures that cover the etched portions of the SiGe NS or NW layers. Source/drain (S/D) epitaxial structures are then formed to abut edge portions of the fin-like structures so that the S/D epitaxial structures are in contact with the Si NS or NW layers and isolated from the SiGe NS or NW layers by the spacer structures. At a later operation, the sacrificial gate structure is removed to expose the top and sidewall surfaces of the fin-like structure. The SiGe NS or NW layers are selectively removed from the fin-like structure. During the selective removal process, the Si NS or NW layers and the spacer structures are not removed. Subsequently, a metal gate structure is formed to surround the Si NS or NW layers. Similar to the SiGe NS or NW layers prior to their selective removal, the metal gate structure is isolated from the S/D epitaxial structures through the spacer structures.

In GAA FETs, the metal gate structure, the spacer structure, and the S/D epitaxial structures form parasitic capacitors that can be detrimental to the operation of the GAA FETs. A low parasitic capacitance can be formed if the spacer material has a low dielectric constant. The embodiments described herein are directed to a spacer material with a low dielectric constant—e.g., between about 3.7 and about 5.2—that mitigates the effect of parasitic capacitances formed between the metal gate structure and the S/D epitaxial structures. In some embodiments, the spacer structures include an air gap or an air cavity, which provides further dielectric constant reduction. In some embodiments, the low dielectric constant spacer material is a silicon nitride based (SiN-based) material with a film density between about 1.7 and about 2.4 g/cm$^3$. In some embodiments, the spacer material has tunable nitrogen and oxygen atomic concentrations. In some embodiments, the nitrogen concentration is controlled by the deposition temperature. In some embodiments, the dielectric constant of the spacer material is tuned by its oxygen-to-nitrogen ratio. For example, higher oxygen-to-nitrogen ratio decreases the dielectric constant of the spacer material and lower oxygen-to-nitrogen ratio increases the dielectric constant of the spacer material. In some embodiments, the spacer material is deposited with a thermal atomic layer deposition (ALD) process using one or more oxygen-free precursor gases. In some embodiments, the spacer material is treated with a post deposition process that includes a thermal-only treatment, an ultra-violet (LTV) treatment or a remote plasma treatment. In some embodiments, the air gap or the air cavity in the spacer structure is formed with a wet etching process that includes diluted hydrofluoric (DHF) acid. In some embodiments, the water-to-HF ratio is between about 100:1 and 500:1. In some embodiments, the wet etching chemistry provides an etching selectivity greater than about 100:1 between the spacer material and the surrounding layers.

According to some embodiments, FIG. 1 is a cross-sectional view of GAA-FETs 100 and 105 formed on a substrate 110. Each of GAA-FETs 100 and 105 includes a gate structure 115, which surrounds Si NS or NW layers 120. By way of example and not limitation, each gate structure 115 includes a dielectric stack formed by an interfacial dielectric layer 115*a* and a high dielectric constant (also referred to herein as "high-k") dielectric 115*b*. In addition, each gate structure 115 includes a gate electrode 115*c*, which further includes capping layers, one or more work function metallic layers, and a metal fill not shown in FIG. 1 for simplicity.

Further, GAA-FETs 100 and 105 include source/drain (S/D) epitaxial structures 125 in contact with Si NS or NW layers 120. Each S/D epitaxial structure 125 may include one or more doped epitaxial layers, which are successively formed on substrate 110. In some embodiments, S/D epitaxial structures 125 are electrically isolated from the layers of gate structures 115 via spacer structures 130. Spacer structures 130 further separate Si NS or NW layers 125 in the vertical direction (e.g., along the z-direction) as shown in FIG. 1.

In some embodiments, each spacer structure 130 includes a spacer material 130*a* with an air gap or air cavity 130*b* (air gap 130*b*). In some embodiments, air gap 130*b* is formed in spacer material 130*a* with a wet etching process prior to the formation of S/D epitaxial structures 125. In some embodiments, air gap 130*b* reduces the dielectric constant of spacer structures 130. This is because air has a dielectric constant of 1, which is lower than that of spacer material 130*a* (e.g., between about 3.7 and about 5.2). In some embodiments, spacer material 130*a* is a SiN-based material, which further includes oxygen and carbon. In some embodiments, spacer material 130*a* has a lower dielectric constant and mass density per unit volume (density) than SiN or silicon carbon nitride (SiCN). In some embodiments, spacer structures 130 reduce parasitic capacitances formed between gate electrodes 115*c* and S/D epitaxial structures 125.

In some embodiments, sidewall surfaces of gate structures 115 in GAA-FETs 100 and 105 are covered by one or more gate spacers. For example, as shown in FIG. 1, sidewall surfaces of gate structures 115 are covered by an inner gate spacer 135*a* and an outer gate spacer 135*b*. In some embodiments, inner gate spacer 135*a* and outer gate spacer 135*b* provide structural support during the formation of gate structures 115. In addition, inner gate spacers 135*a* and outer gate spacers 135*b* provide electrical isolation and protection to gate structures 115 during the formation of S/D contacts, which are not shown in FIG. 1. According to some embodiments, the S/D contacts are disposed on S/D epitaxial structures 125, adjacent to and between gate structures 115. In some embodiments, outer gate spacers 135*b* extend over S/D epitaxial structures 125 as shown in FIG. 1. In some embodiments, outer spacers 135*b* are surrounded by an interlayer dielectric (ILD) 140, which provides additional electrical isolation to the conductive components of GAA-FETs 100 and 105.

In some embodiments, GAA-FETs 100 and 105 include an optional layer 145 disposed between gate structures 115 and the uppermost Si NS or NW layer 120 as shown in FIG. 1. According to some embodiments, optional layer 145 is an etch stop layer that facilitates the patterning process of intermediate sacrificial gate structures in prior fabrication stages. By way of example and not limitation, optional layer 145 can include silicon oxide, SiN, SiCN, silicon oxy-nitride (SiON), or silicon oxy-carbon-nitride (SiOCN) and has a thickness less than about 10 nm.

In some embodiments, GAA-FETs 100 and 105 can be n-type or p-type (e.g., pFETs or nFETs). Additional GAA-FETs, similar to the GAA-FETs shown in FIG. 1, can be formed over substrate 110. These additional GAA-FETs are within the spirit and the scope of this disclosure. By way of example and not limitation, p-type GAA FETs include S/D epitaxial structures 125 with boron-doped (B-doped) silicon-germanium (SiGe:B) layers, B-doped germanium (Ge:B) layers, B-doped germanium-tin (GeSn:B) layers, or combinations thereof. In some embodiments, n-type GAA FETs include S/D epitaxial structures 125 with arsenic (As)-doped silicon layers (Si:As), phosphorous (P)-doped silicon layers (Si:P), carbon-doped silicon layers (Si:C), or combinations thereof. By way of example and not limitation, S/D epitaxial structures 125 are grown directly on top surfaces of substrate 110.

Figure 2A:
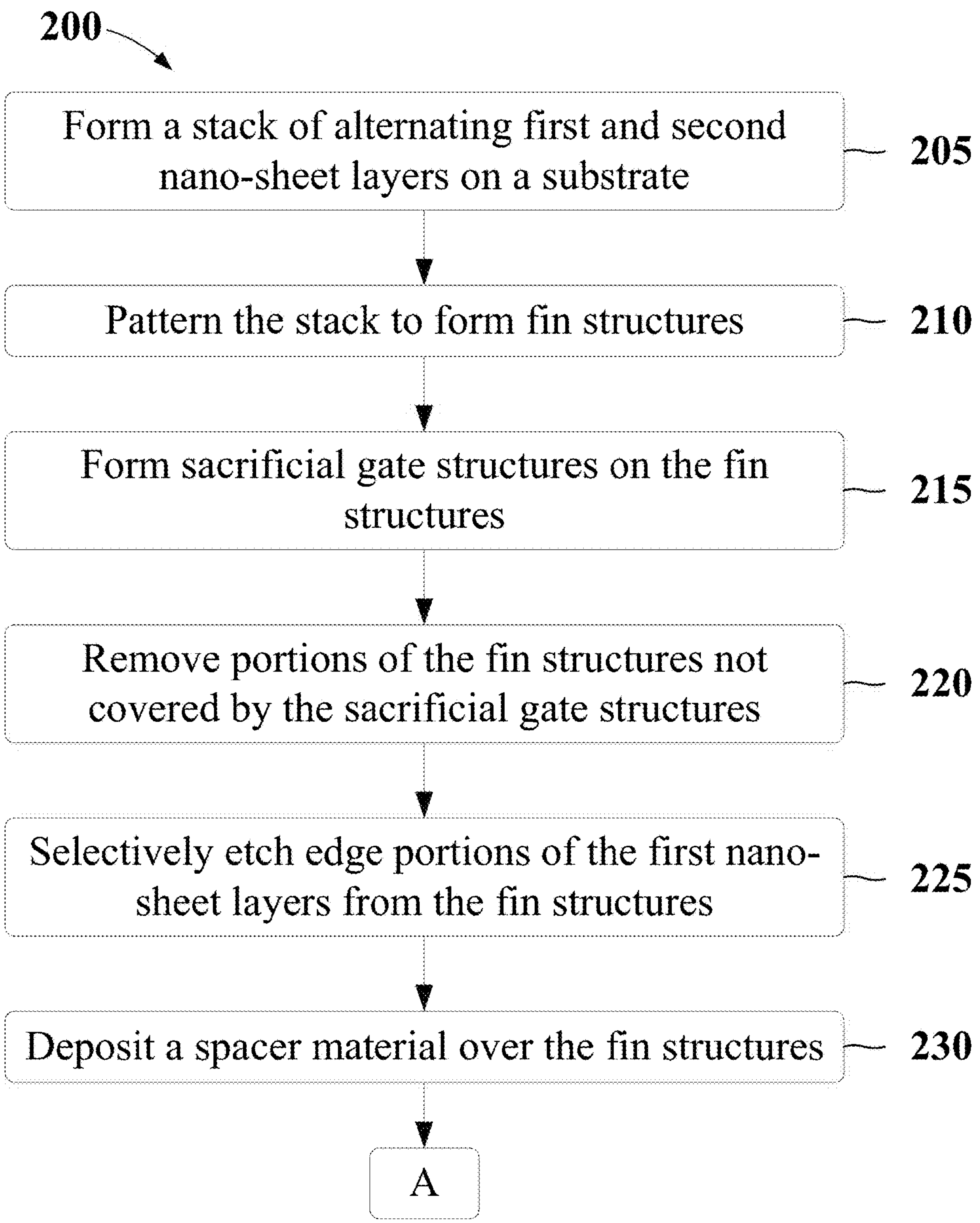
FIGS. 2A and 2B are flow charts of a fabrication method for the formation of spacer structures between gate structures and source/drain epitaxial structures of nanostructure transistors, in accordance with some embodiments.
Figure 2B:
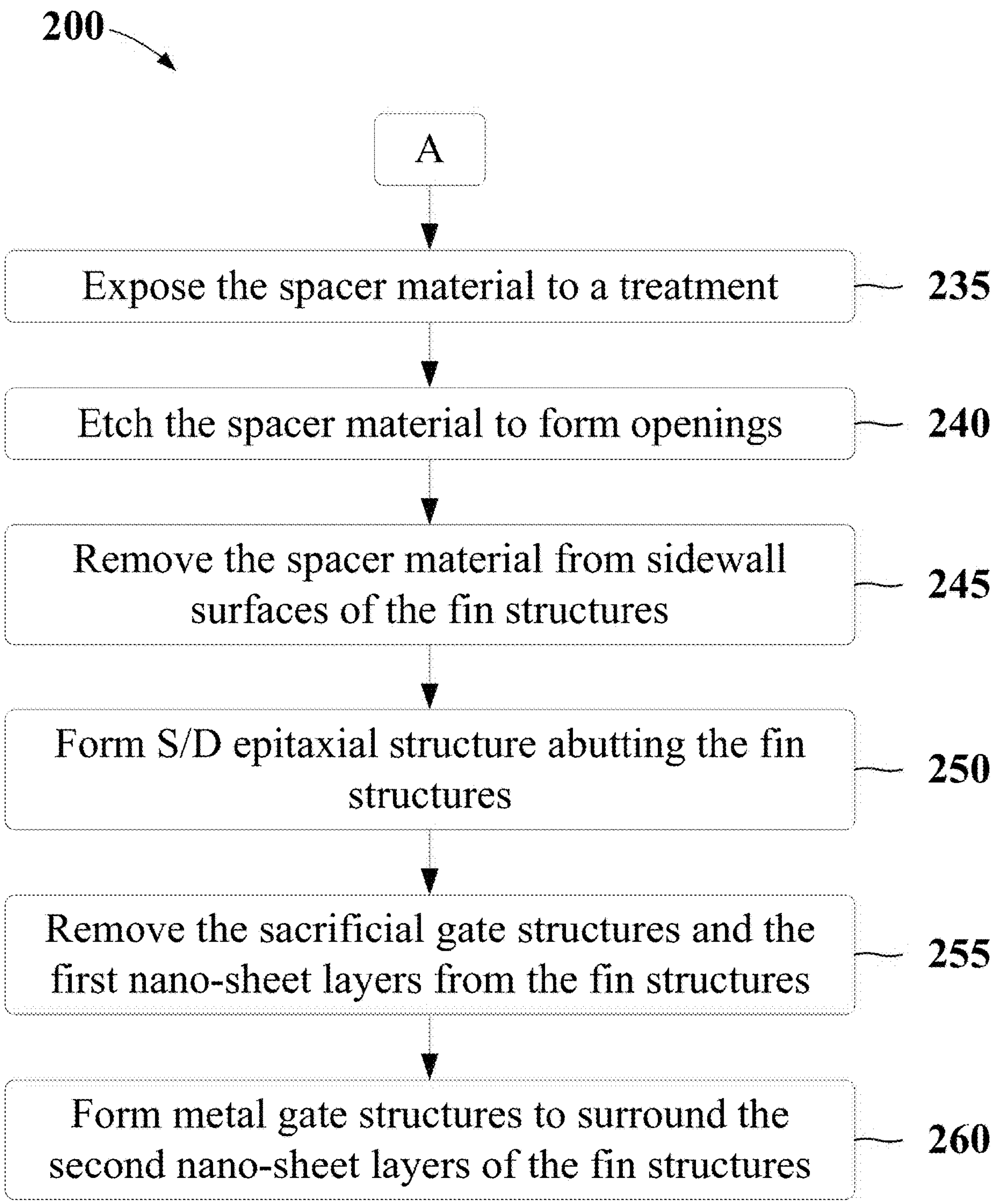

According to some embodiments, FIGS. 2A and 2B are flowcharts of a fabrication method 200 for the formation of spacer structures 130 in GAA-FETs 100 and 105 shown in FIG. 1. Other fabrication operations can be performed between the various operations of method 200 and are omitted merely for clarity. This disclosure is not limited to this operational description and additional operations may be performed. Moreover, not all operations may be necessary to perform the disclosure provided herein. Additionally, some of the operations may be performed simultaneously, or in a different order than the one shown in FIGS. 2A and 2B. In some embodiments, one or more other operations may be performed in addition to or in place of the presently described operations. For illustrative purposes, method 200 is described with reference to the structures shown in FIGS. 3 through 16.

In referring to FIG. 2A, method 200 begins with operation 205 and the process of forming a stack of alternating first and second NS layers on a substrate (e.g., on substrate 110). In some embodiments, the substrate (e.g., substrate 110) includes silicon or another elementary semiconductor, such as germanium (Ge). In some embodiments, the substrate includes a compound semiconductor like silicon carbide (SiC), gallium arsenide (GaAs), gallium phosphide (GaP), indium phosphide (InP), indium arsenide (InAs), or indium antimonide (InSb). In some embodiments, the substrate includes an alloy semiconductor, like silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the substrate includes any combination of the aforementioned materials. In some embodiments, substrate 110 is intrinsic (e.g., un-doped) or doped. In some embodiments, substrate 110 includes doped and un-doped regions.

Figure 3:
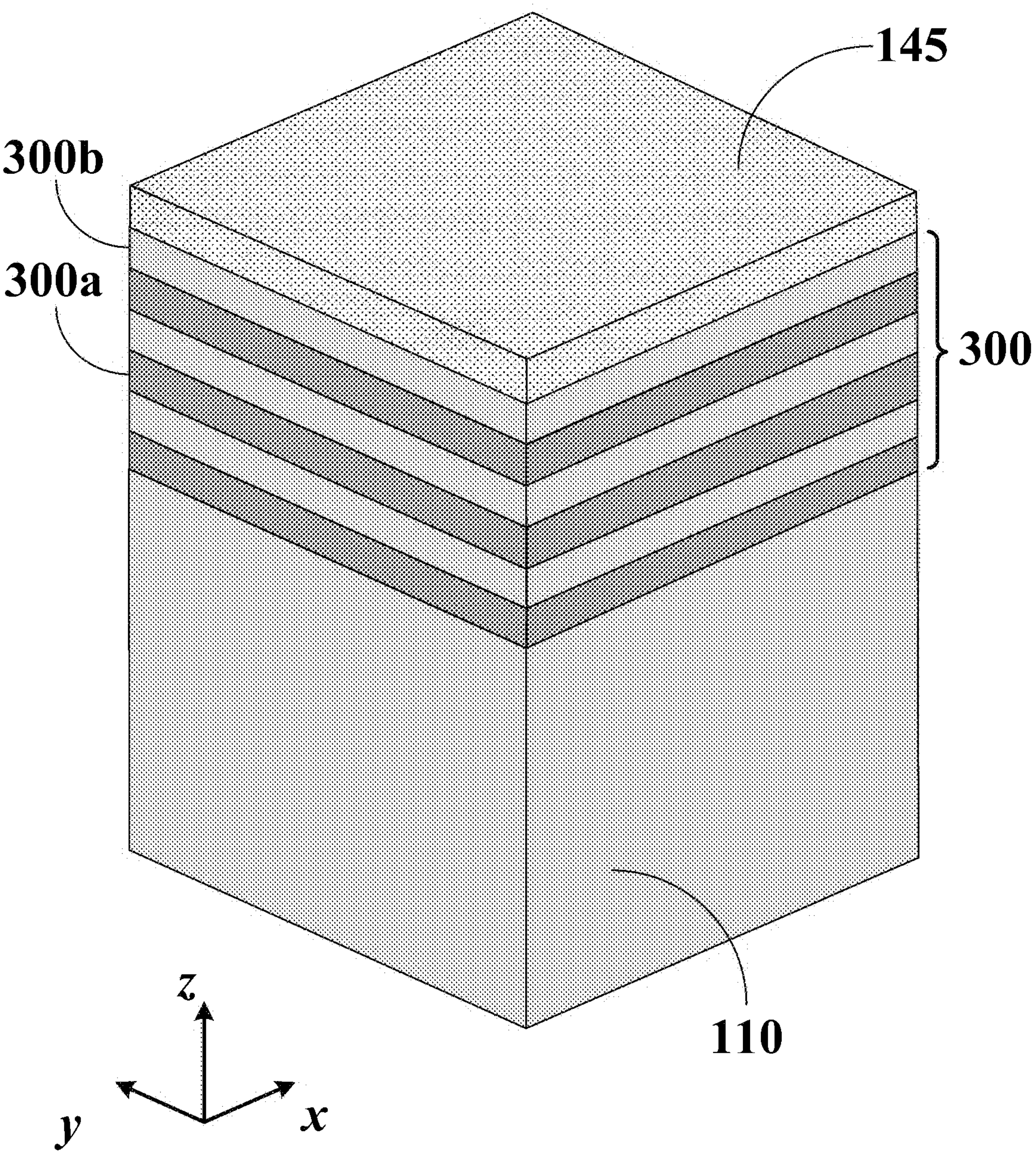
FIGS. 3 and 4 are isometric views of intermediate structures during the fabrication of spacer structures between gate structures and source/drain epitaxial structures of nanostructure transistors, in accordance with some embodiments.

In some embodiments, FIG. 3 is an isometric view of substrate 110 after operation 205 and the formation of a stack 300 of alternating first and second NS layers **300*a* and 300*b*. In some embodiments, first and second NS layers 300*a* and 300*b* are formed on exposed top surfaces of substrate 110. In some embodiments, first NS layers 300*a* are sacrificial NS layers, which are removed later in the fabrication process. Second NS layers 300*b* correspond to Si NS or NW layers 120 shown in FIG. 1. In some embodiments, the material of first NS layers 300*a* in stack 300 is selected so that first NS layers 300*a* can be selectively removed via etching from stack 300 without removing second NS layers 300*b*. For example, if second NS layers 300*b* are Si NS layers, first NS layers 300*a* can be SiGe NS layers. In some embodiments, the deposition sequence begins with the type of the NS layers to be removed—for example, in this case with first NS layer 300*a***.

First and second NS layers **300*a* and 300*b* can be grown with any suitable method. For example, first and second NS layers 300*a* and 300*b* can be grown with a chemical vapor deposition (CVD) process with precursor gases like silane ($SiH_4$), disilane ($Si_2H_6$), dichlorosilane ($SiH_2Cl_2$), germane ($GeH_4$), digermane ($Ge_2H_6$), other suitable gases, or combinations thereof. In some embodiments, first NS layers 300*a* include a Ge concentration between about 15 at. % and about 40 at. %, while second NS layers 300*b* are substantially germanium-free—e.g., have a Ge concentration less than about 1 at. %. In some embodiments, second NS layers 300*b*, which correspond to Si NS or NW layers 120 in FIG. 1, form the channel region of GAA-FETs 100 and 105 and can be lightly doped or intrinsic (e.g., un-doped). If lightly doped, the doping level of second NS layers 300*b* is less than about $1\times10^{13}$ atoms/$cm^3$. First and second NS layers 300*a* and 300*b* can be sequentially deposited without a vacuum break (e.g., in-situ) to avoid oxidation and the formation of any intervening layers between first and second NS layers 300*a* and 300*b*. In some embodiments, first NS layers 300*a* can be doped to increase their etching selectivity compared to second NS layers 300*b*** in a subsequent etching operation.

In some embodiments, the thickness of first NS layers **300*a* controls the spacing between every other second NS layer 300*b* in stack 300. The thickness of first and second NS layers 300*a* and 300*b* can range, for example, from about 6 nm to about 16 nm. Since first and second NS layers 300*a* and 300*b* are grown individually, the thickness of each NS layer can be adjusted independently based, for example, on the deposition time during growth. In some embodiments, additional or fewer number of first and second NS layers 300*a* and 300*b* can be formed in stack 300. In some embodiments, the total number of NS layers is 2n where n is the number of first NS layers 300*a* or the number of second NS layers 300*b* in stack 300**.

In some embodiments, optional layer 145 is blanket-deposited on stack 300 as shown in FIG. 3. Optional layer 145 can be deposited with any appropriate thermal or plasma-assisted deposition method including, but not limited to, CVD, plasma-enhanced CVD (PECVD), ALD, physical vapor deposition (PVD), and the like. In some embodiments, the thickness of optional layer 145 is between about 2 nm and about 3 nm.

In referring to FIG. 2A, method 200 continues with operation 210 and the process of patterning stack 300 to form fin structures. In some embodiments, stack 300 is patterned to form fin structures with a width along the y-direction and a length along the x-direction. The fin structures can be formed by patterning with any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over stack 300 and patterned using a photolithography process. Spacers are formed alongside the patterned sacrificial layer using a self-aligned process. The sacrificial layer is then removed, and the remaining spacers may then be used as masking structures to pattern the fin structures.

Figure 4:
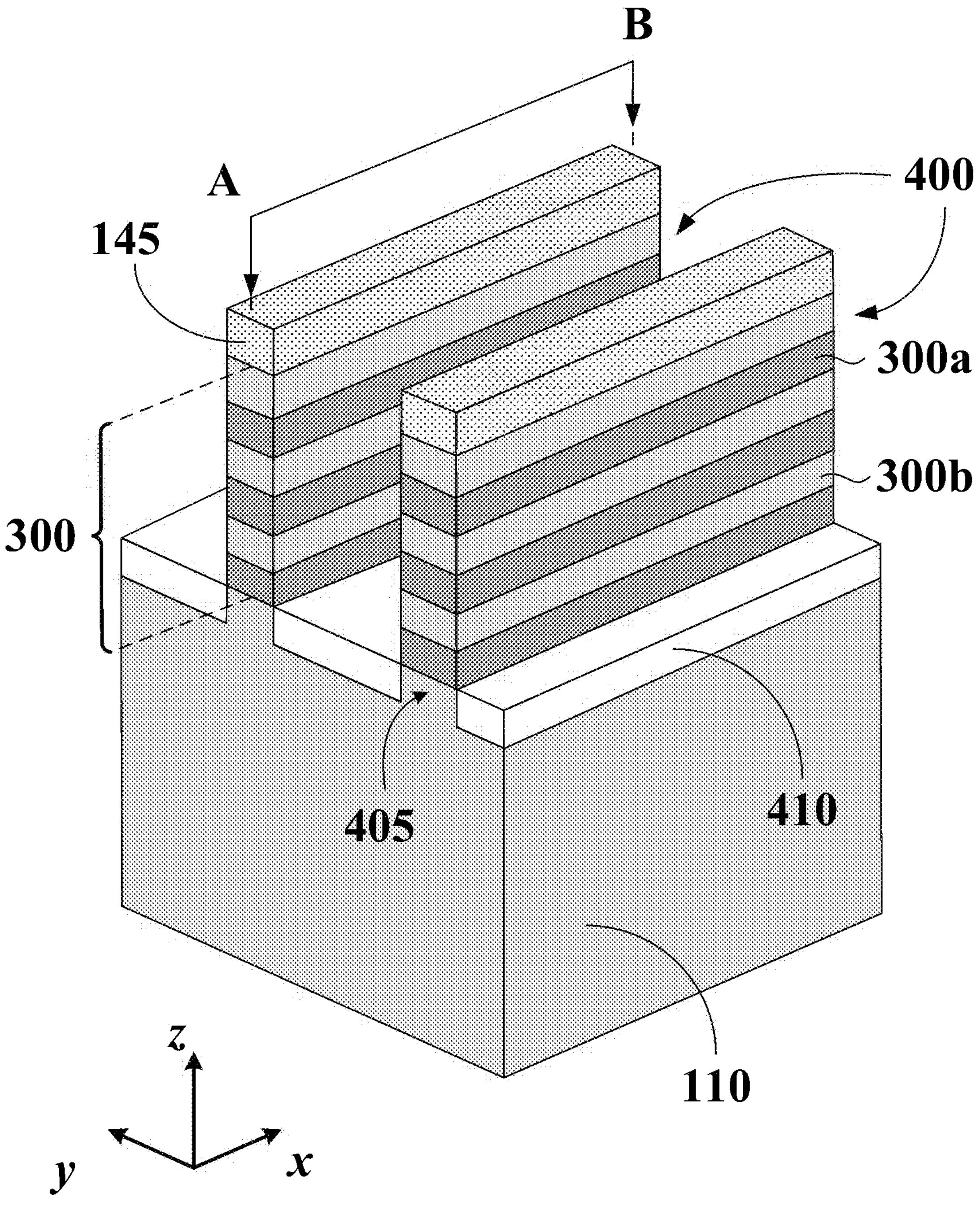

By way of example and not limitation, FIG. 4 is an isometric view of fin structures 400 formed from stack 300 with the aforementioned patterning process. In some embodiments, optional layer 145 is patterned with stack 300 in operation 210. Consequently, patterned optional layer 145 remains on each fin structure 400 as shown in FIG. 4. In some embodiments, the aforementioned patterning process does not terminate on the top surface of substrate 110 but continues to etch a top portion of substrate 110 to form a pedestal structure 405 from substrate 110 under each fin structure 400. In some embodiments, this facilitates the formation of an isolation structure and the S/D epitaxial structures described below. Since fin structures 400 and pedestal structures 405 are formed with the same patterning process, fin structures 400 and pedestal structures 405 are substantially aligned to each other. For example, sidewall surfaces of fin structures 400 in the x-z plane and y-z plane are substantially aligned to respective sidewall surfaces of pedestal structures 405 as shown in FIG. 4.

Additional fin structures, like fin structures 400, can be formed on substrate 110 in the same or different area of substrate 110. These additional fin structures are not shown in FIG. 4 for simplicity. By way of example and not limitation, each fin structure 400 has a width along the y-direction between about 5 nm and about 40 nm.

In some embodiments, layers **300*a* and 300*b* are referred to as "nano-sheets" when their width along the y-direction is different from their height along z-direction—for example, when their width is larger/narrower than their height. In some embodiments, layers 300*a* and 300*b* are referred to as "nano-wires" when their width along the y-direction is equal to their height along z-direction. In some embodiments, layers 300*a* and 300*b* are deposited as nano-sheets and subsequently patterned to form nano-wires with equal height and width. By way of example and not limitation, layers 300*a* and 300*b* will be described in the context of nano-sheets (NS) layers. Based on the disclosure herein, nano-wires (NW), as discussed above, are within the spirit and the scope of this disclosure. Further, for example purposes and without limiting the scope of this disclosure, first and second NS layers 300***a* and 300*b* in method 200 will be described in the context of Si and SiGe NS layers, respectively.

In some embodiments, after the formation of fin structures 400, an isolation structure 410 is formed on etched or recessed portions of substrate 110 to cover sidewall surfaces of pedestal structures 405 as shown in FIG. 4. In some embodiments, isolation structure 410 is a shallow trench isolation (STI) structure that electrically isolates fin structures 400 and includes one or more silicon oxide based dielectrics. By way of example and not limitation, isolation structure 410 can be formed as follows. An isolation structure material (e.g., a silicon oxide based dielectric) is blanket deposited over fin structures 400 and substrate 110. The as-deposited isolation structure material is planarized (e.g., with a chemical mechanical polishing (CMP) process) so that the top surface of the isolation structure material is substantially coplanar with top surfaces of optional layer 145 or with the top surface of fin structures 400 if optional layer 145 is absent. The planarized isolation structure material is subsequently etched-back with a dry etching process so that the resulting isolation structure 410 has a height substantially similar to pedestal structure 405, as shown in FIG. 4. In some embodiments, stack 300 protrudes from isolation structure 410 so that isolation structure 410 does not cover any sidewall portion of stack 300 as shown in FIG. 4. This facilitates the formation of GAA-FETs 100 and 105 shown in FIG. 1, according to some embodiments.

Figure 5:
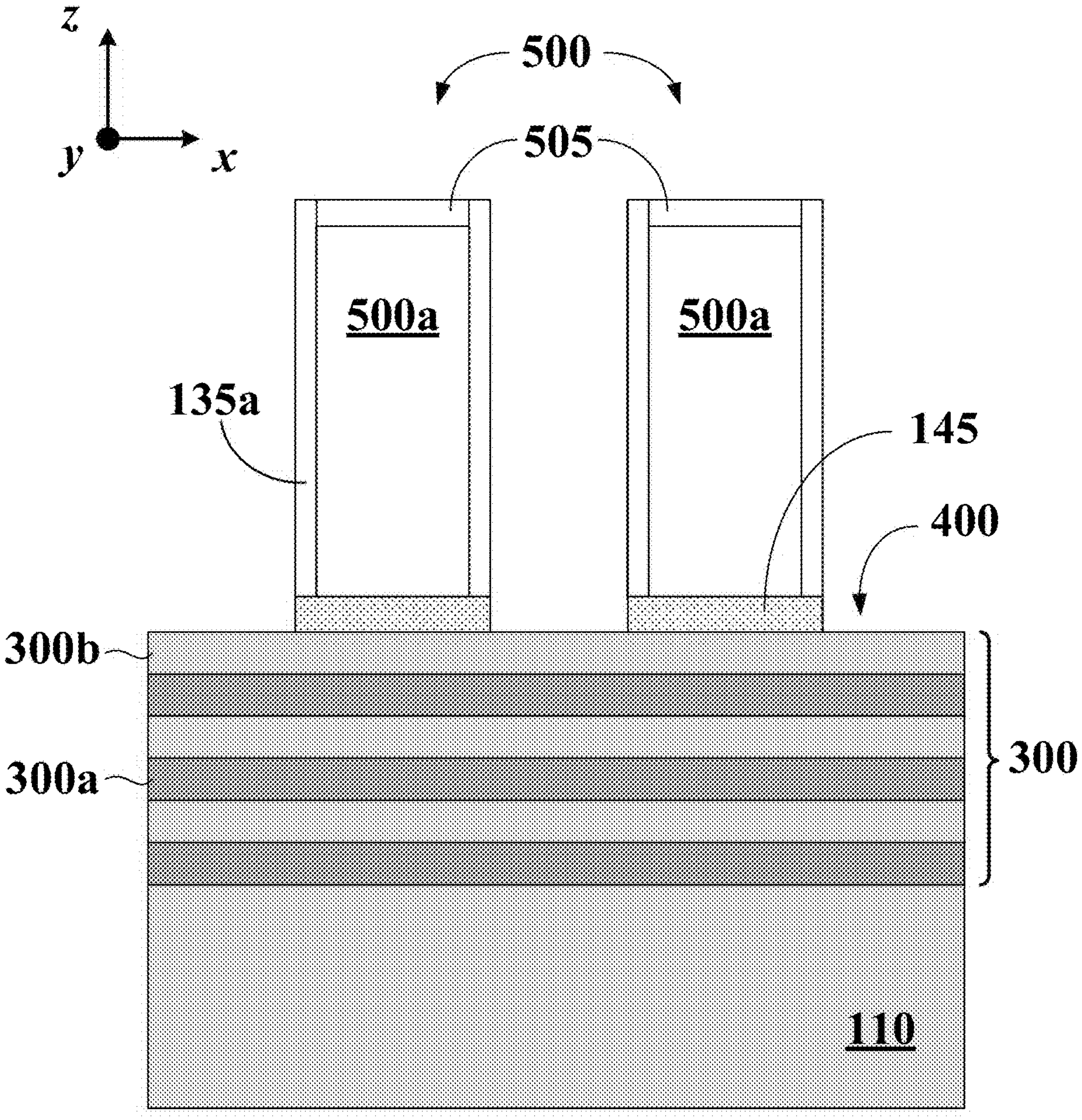
FIGS. 5 through 8 are cross-sectional views of intermediate structures during the fabrication of spacer structures between gate structures and source/drain epitaxial structures of nanostructure transistors, in accordance with some embodiments.

In referring to FIG. 2A, method 200 continues with operation 215 and the process of forming sacrificial gate structures on fin structures 400. In some embodiments, the sacrificial gate structures are formed with their length along the y-direction—e.g., perpendicular to fin structures 400 shown in the isometric view of FIG. 4—and their width along the x-direction. By way of example and not limitation, FIG. 5 is a cross-sectional view of FIG. 4 along cut-line AB. FIG. 5 shows sacrificial gate structures 500 formed on portions of fin structures 400. Because FIG. 5 is a cross-sectional view, as opposed to an isometric view, portions of sacrificial gate structures 500 covering sidewall portions of fin structures 400 are not shown. Further, in the cross-sectional view of FIG. 5, only one of fin structures 400 from FIG. 4 is shown. In some embodiments, portions of gate structures 500 are formed between fin structures 400 and on isolation structure 410 shown in FIG. 4.

In some embodiments, sacrificial gate structures 500 cover top and sidewall portions of fin structures 400. In some embodiments, sacrificial gate structures 500 are replaced by gate structures 115 shown in FIG. 1 during a gate replacement process. Sacrificial gate structures 500 include a sacrificial gate electrode 500*a* formed on a sacrificial gate dielectric not shown in FIG. 5 for simplicity. At this fabrication stage, inner gate spacers 135*a* and capping layers 505 are formed on sidewall and top surfaces of sacrificial gate structures 500. As discussed above, inner gate spacers 135*a* are not removed during the gate replacement process; instead, inner gate spacers 135*a* facilitate the formation of gate structures 115 shown in FIG. 1. By way of example and not limitation, inner gate spacers 135*a* include SiOCN, SiCN, silicon-oxy-carbide (SiOC), carbon-doped SiN (SiN:C), carbon-doped SiON (SiON:C), or combinations thereof. In some embodiments, capping layers 505 protect sacrificial gate electrodes 500*a* from subsequent etching operations discussed below and may include, for example, a bottom silicon oxide ($SiO_2$) layer and a top SiN layer.

By way of example and not limitation, sacrificial gate structures 500 can be formed as follows. The sacrificial gate layers (e.g., the sacrificial gate dielectric and sacrificial gate electrode 500*a*) are deposited on optional layer 145 or directly on fin structures 400 if optional layer 145 is not present. Subsequently, capping layer 505 is deposited on the sacrificial gate layers and patterned. By way of example and not limitation, the patterned capping layer 505 can be used as a hard mask (e.g., etching mask) for the patterning process of the sacrificial gate layers and the formation of gate structures 500. By way of example and not limitation, the patterning process of the sacrificial gate layers can terminate on optional layer 145. Inner gate spacers 135*a* are subsequently formed on sacrificial gate structures 500 as shown in FIG. 5 by first depositing the inner gate spacer material and then anisotropically etching it so that inner gate spacers 135*a* are formed on sidewall surfaces of sacrificial gate structure 500. By way of example and not limitation, a second patterning process (e.g., with a different etching chemistry) can etch optional layer 145 while using sacrificial gate structures 500 and inner gate spacers 135*a* as an etching mask. This prevents the patterning process of sacrificial gate layers from etching the uppermost Si NS layer 300*b* of fin structure 400 and relaxes the gate patterning process window. The operations for the formation of sacrificial gate structures 500 described above are exemplary and not limiting. Therefore, alternative operations in a similar or different order may be used to form gate sacrificial structures 500, inner gate spacers 135*a*, and capping layer 505. These alternative operations are within the spirit and the scope of this disclosure. In some embodiments, sacrificial gate structures 500 are formed over multiple fin structures 400.

As shown in FIG. 5, edge portions of fin structures 400 are not covered by sacrificial gate structures 500. This is because the patterned width of sacrificial gate structures 500 is narrower than the length of fin structures 400 along the x-direction. In some embodiments, sacrificial gate structures 500 are used as masking structures in subsequent etching operations to define the channel regions of GAA-FETs 100 and 105 shown in FIG. 1. For this reason, in some embodiments, the lateral dimensions (e.g., the width and length) of sacrificial gate structures 500 and gate structures 115 are substantially similar.

Figure 6:
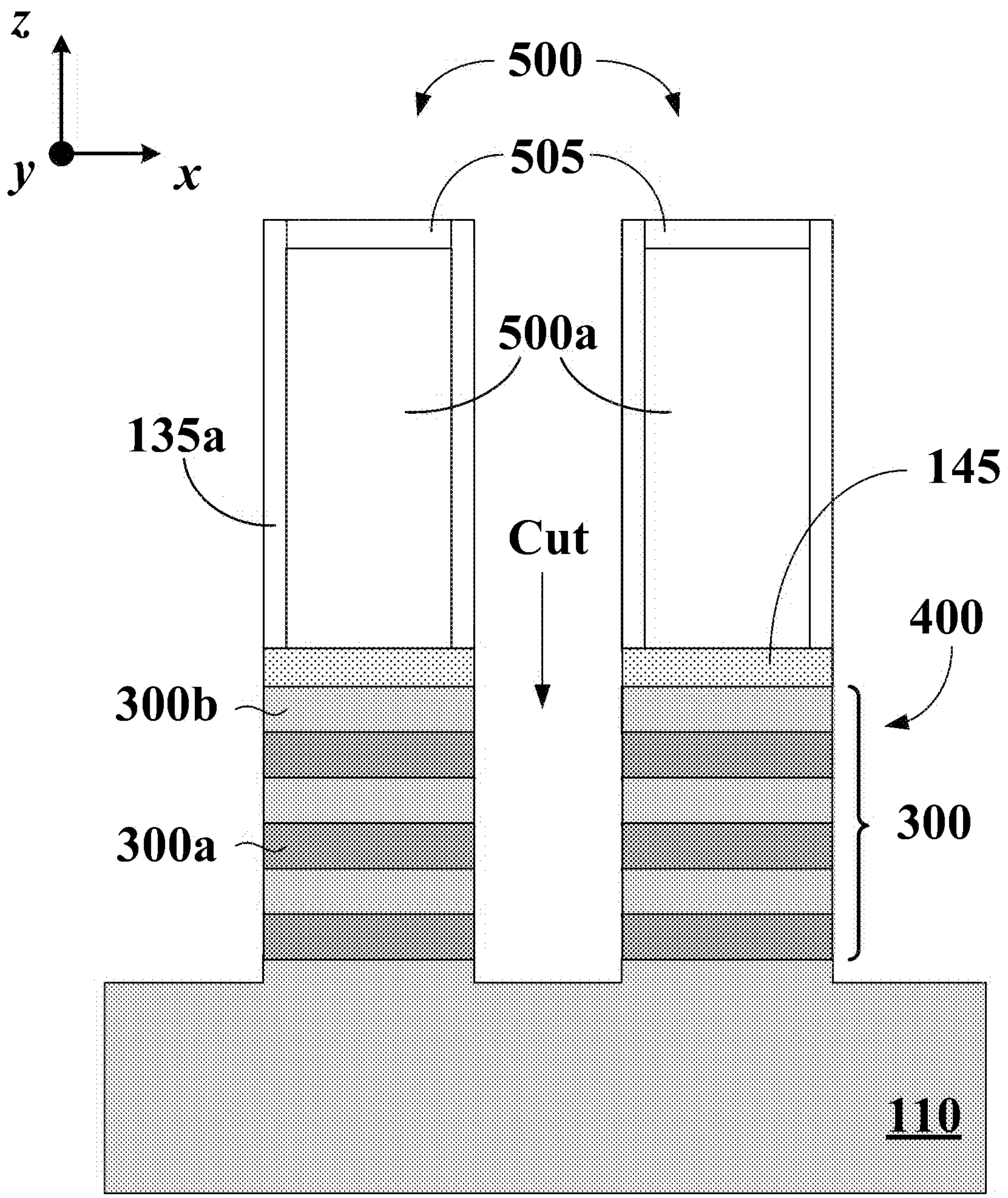

In referring to FIG. 2A, method 200 continues with operation 220 and the process of removing (e.g., “trimming”) portions of fin structures 400 not covered by sacrificial gate structures 500. As discussed above, the edge portions of fin structures 400 are not covered by sacrificial gate structures 500 and are therefore removed in operation 220. In some embodiments, FIG. 6 shows the structure of FIG. 5 after operation 220. In some embodiments, the removal process involves a dry etching process, a wet etching process, or combinations thereof. The removal process is selective towards second NS layers 300*b* and first NS layers 300*a* (e.g., selective to Si and SiGe materials). In some embodiments, the dry etching process includes etchants with an oxygen-containing gas, a fluorine-containing gas, a chlorine-containing gas, a bromine-containing gas, other suitable etching gases and/or plasmas, or combinations thereof. Examples of oxygen containing gases include, but are not limited to, oxygen ($O_2$) and sulfur dioxide ($SO_2$). Examples of fluorine-containing gases include, but are not limited to, carbon tetrafluoride ($CF_4$), sulfur hexafluoride ($SF_6$), difluoromethane ($CH_2F_2$), trifluoromethane ($CHF_3$), and hexafluoroethane ($C_2F_6$). Examples of chlorine-containing gases include, but are not limited to, chlorine ($Cl_2$), chloroform ($CHCl_3$), carbon tetrachloride ($CCl_4$), silicon tetrachloride ($SiCl_4$), and boron trichloride ($BCl_3$). Examples of bromine-containing gases include, but are not limited to, hydrogen bromide (HBr) and bromoform ($CHBr_3$). By way of example and not limitation, the wet etching chemistry can include a solution of diluted hydrofluoric acid (DHF), potassium hydroxide (KOH), and ammonia; a solution of hydrofluoric acid (HF), nitric acid ($HNO_3$), and acetic acid ($CH_3COOH$); or a combination of the above.

In some embodiments, the etchants of the aforementioned etching process do not substantially etch sacrificial gate structures 500—which are protected by capping layers 505 and inner gate spacers 135*a*—and isolation structure 410 shown in FIG. 4. This is because capping layers 505, inner gate spacers 135*a*, and isolation structure 410 include materials with a low etching selectivity, such as a silicon nitride based material (e.g., SiN, SiCN, SiOCN, etc.) or silicon oxide based material. In some embodiments, isolation structure 410 shown in FIG. 4 is used as an etch stop layer for the etching process described above.

Operation 220 forms a "cut" in each fin structure 400 as shown in FIG. 6. The cut divides each fin structure 400 into two separate portions, in which each portion is covered by a sacrificial gate structure 500.

Figure 7:
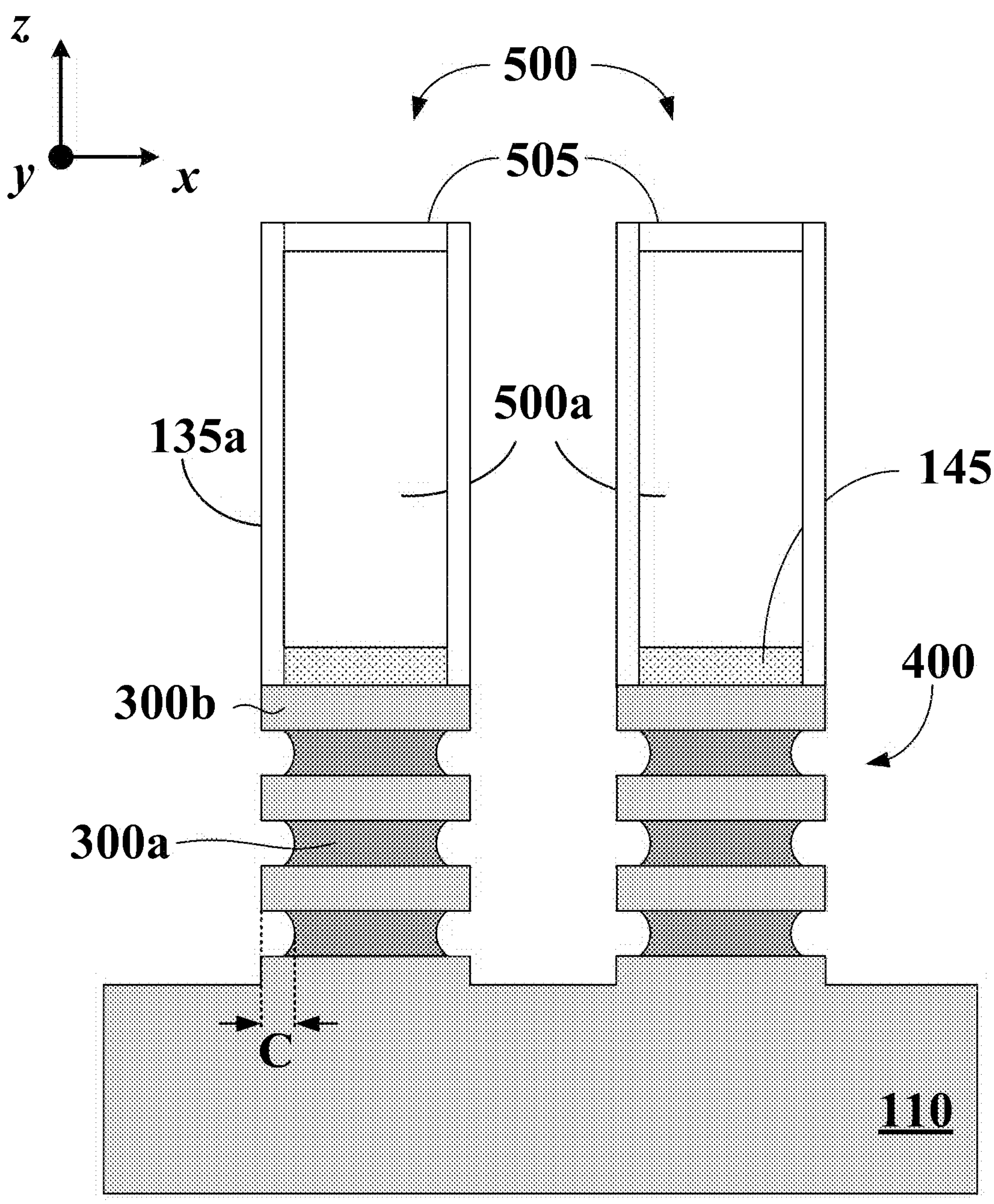

In referring to FIG. 2A, method 200 continues with operation 225 and the process of selectively etching edge portions of first NS layers 300*a* from fin structures 400. According to some embodiments, FIG. 7 shows the structure of FIG. 6 after operation 225 where exposed edges of first NS layers 300*a* are laterally etched (e.g., recessed) along the x-direction. According to some embodiments, exposed edges of first NS layers 300*a* are recessed (e.g., partially etched) by an amount C that ranges from about 5 nm to about 15 nm along the x-direction as shown in FIG. 7. In some embodiments, spacer structures 130 shown in FIG. 1 will be formed in the recessed portions of first NS layers 300*a*. These recessed portions of first NS layers 300*a*, which are referred to as spacer cavities, have a width C along the x-direction. According to some embodiments, spacer cavities with a width C less than about 5 nm result in spacer structures 130 that are too thin to provide adequate electrical isolation between gate structures 115 and S/D epitaxial structures 125 shown in FIG. 1. On the other hand, spacer cavities with a width C greater than about 15 nm result in spacer structures 130 that reduce the gate length of the resulting transistor structures (e.g., GAA FETs 100 and 105).

In some embodiments, the recess in first NS layers 300*a* can be formed with a dry etching process selective towards SiGe. For example, halogen-based chemistries exhibit a high etching selectivity towards Ge and a low etching selectivity towards Si. Therefore, halogen gases etch Ge-containing layers, such as first NS layers 300*a*, at a higher etching rate than substantially Ge-free layers like second NS layers 300*b*. In some embodiments, the halogen-based chemistries include fluorine-based and/or chlorine-based gases. Alternatively, a wet etching chemistry with high selectivity towards SiGe can be used. By way of example and not limitation, a wet etching chemistry may include buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof. The aforementioned etching processes can be timed so that the desired amount of SiGe is removed.

In some embodiments, first NS layers 300*a* with a higher Ge atomic concentration have a higher etching rate than first NS layers 300*a* with a lower Ge atomic concentration. Therefore, the etching rate of the aforementioned etching processes can be adjusted by modulating the Ge atomic concentration (e.g., the Ge content) in first NS layers 300*a*. As discussed above, the Ge content in first NS layers 300*a* can range from about 15% to about 40%. In some embodiments, the Ge concentration is selected based on the etching process used. For example, a wide Ge concentration range (e.g., between about 15% and about 40%) can be used for a wet etching process and a narrow Ge concentration range (e.g., between about 20% and about 30%) can be used for a dry etching process. In some embodiments, and independent of the etching process used, a SiGe nano-sheet layer with a low Ge concentration (e.g., about 20% Ge) is etched slower than a SiGe nano-sheet layer with a higher Ge concentration (e.g., about 30% Ge). Consequently, the Ge concentration can be adjusted accordingly to achieve the desired etching rate and selectivity between first NS layers 300*a* and second NS layers 300*b* based on the etching process.

In some embodiments, a Ge concentration below about 15% for a wet etching process or 20% for a dry etching process does not provide adequate selectivity between first NS layers 300*a* and second NS layers 300*b*. For example, the etching rate between first NS layers 300*a* and second NS layers 300*b* becomes comparable and both types of nano-sheet layers can be etched during the etching process. On the other hand, for Ge concentrations higher than about 40%, Ge atoms can out-diffuse from first NS layers 300*a* towards second NS layers 300*b* (e.g., during growth) and change the selectivity between first NS layers 300*a* and second NS layers 300*b* during etching. Since Ge out-diffusion cannot be controlled, Ge concentrations higher than about 40% can result in unpredictable etching amounts. In some embodiments, first NS layers 300*a* are doped during deposition to further tune the etching selectivity.

Figure 8:
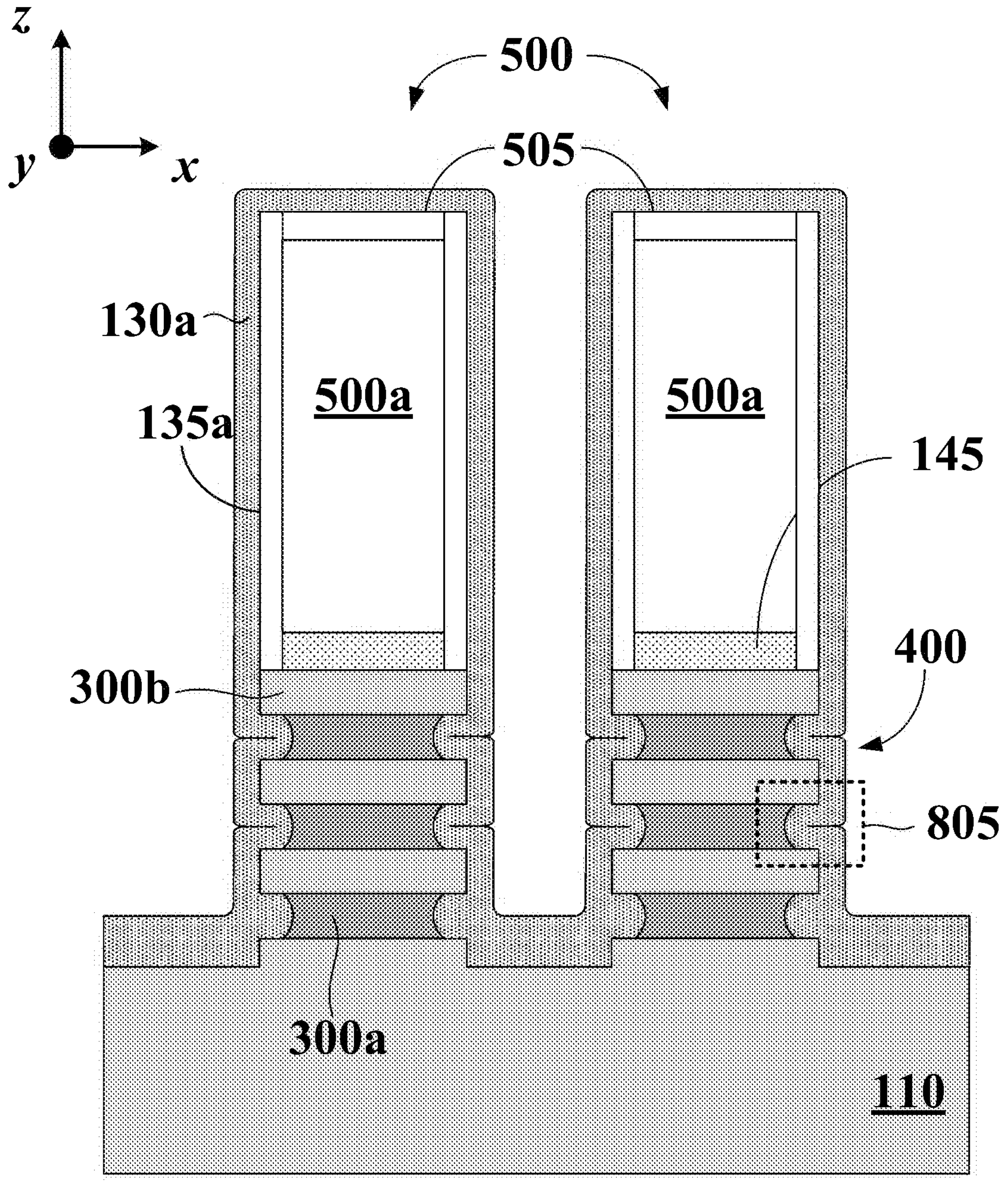

In referring to FIG. 2A, method 200 continues with operation 230 and the process of depositing a spacer material over fin structures 400. In some embodiments and in referring to FIG. 8, a spacer material 130*a* can be blanket deposited over the entire structure of FIG. 7 as shown in FIG. 8. For example, spacer material 130*a* is deposited on the exposed surfaces of substrate 110, fin structure 400, gate spacers 135, and capping layer 705. In some embodiments, spacer material 130*a* is deposited at a thickness between about 4 nm and about 9 nm to cover edge portions of fin structure 400 as shown in FIG. 8.

In some embodiments, spacer material 130*a* is a SiN-based dielectric, which further includes carbon and nitrogen. In some embodiments, the deposition process of spacer material 130*a* does not include oxygen sources; instead, oxygen is incorporated in spacer material 130*a* when spacer material 130*a* is exposed to air—for example, during a vacuum break after the deposition of spacer material 130*a*. In some embodiments, spacer material 130*a* is deposited with a thermal ALD process using one or more precursors. In some embodiments, spacer material 130*a* is deposited with oxygen-free halogen precursors or organic precursors. In some embodiments, the organic precursors may or may not contain nitrogen.

Figure 17A:
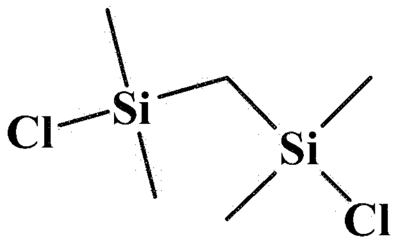
FIGS. 17A through 17F are chemical precursors for the deposition of spacer material between gate structures and source/drain epitaxial structures of nanostructure transistors, in accordance with some embodiments.
Figure 17B:
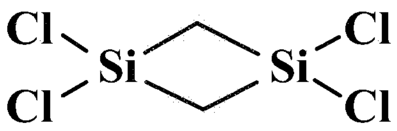

In some embodiments, the halogen precursors can have the general form as $Si(CH_2)SiR_xCl_y$, where R is hydrogen (—H) or a methyl group (—$CH_3$), with $x \geq 0$, $y \geq 1$, and $x+y=6$. An example of a halogen precursor with the aforementioned general form is $SiCH_2Si(CH_3)_4Cl_2$ shown in FIG. 17A. In some embodiments, the halogen precursors can have the general form $Si(CH_2)_2SiR_xCl_y$, where R is —H or —$CH_3$, with $x \geq 0$, $y \geq 1$, and $x+y=4$. An example of a halogen precursor with the aforementioned general form is $Si(CH_2)_2SiCl_4$ shown in FIG. 17B. In some embodiments, the halogen precursors can have the general form $Si(CH_3)_xCl_y$ with x≥1 and x+y=4. An example of a halogen precursor with the aforementioned general form is $Si(CH_3)_2Cl_2$.

Figure 17C:
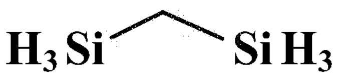
Figure 17D:
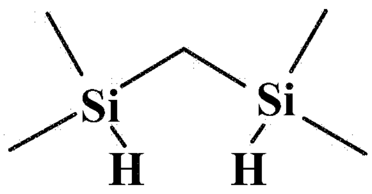
Figure 17E:
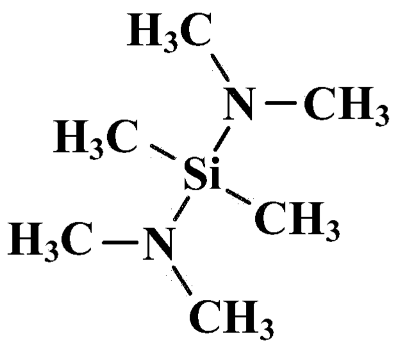
Figure 17F:
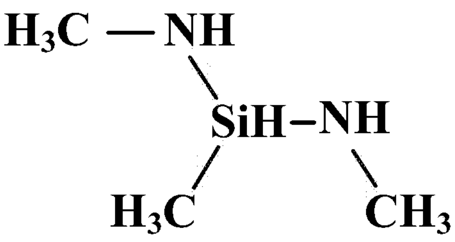

In some embodiments, nitrogen-free organic precursors can have the general form $Si(CH_2)Si(CH_3)_xH_y$, with x≥0, y≥2, and x+y=6. Examples of nitrogen-free organic precursors with the aforementioned general form include, but are not limited to, $Si(CH_2)SiH_6$ shown in FIG. 17C and $SiCH_2Si(CH_3)_4H_2$ shown in FIG. 17D. In some embodiments, the nitrogen-containing organic precursors can have the general form $SiH_x(R_1)_y(R_2)_z$, where $R_1$ is —$CH_3$, $R_2$ is $NH(CH_3)$ or $N(CH_3)_2$ with x≥0, y≥1, z≥1, and x+y+z=4. Examples of nitrogen-containing organic precursors with the aforementioned general form include, but are not limited to, $Si(CH_3)_2(N(CH_3)_2)_2$ shown in FIG. 17E and $SiH(CH_3)(NH(CH_3))_2$ shown in FIG. 17F.

In some embodiments, carrier gases that can be used with the above precursors include, but are not limited to, nitrogen ($N_2$), helium (He), and argon (Ar). In some embodiments, the reactant gases include ammonia ($NH_3$), an $NH_3$ and hydrogen ($H_2$) mixture, and a forming gas (e.g., a $N_2$ and $H_2$ gas mixture). In some embodiments, the deposition temperature ranges from about 150° C. to about 650° C.

In some embodiments, the silicon and carbon incorporation in spacer material 130*a* are controlled via the precursor selection. In some embodiments, the carbon concentration in spacer material 130*a* ranges between about 3% and about 8%. However, the nitrogen concentration in spacer material 130*a* is controlled via the deposition temperature. More specifically, higher deposition temperatures (e.g., about 600° C. or higher) promote the nitrogen incorporation while lower deposition temperatures (e.g., about 400° C. or lower) suppress the nitrogen incorporation. For example, a deposition temperature of about 600° C. can result in a nitrogen concentration between about 35% and about 45% while a deposition temperature of about 400° C. can result in a nitrogen concentration between about 15% and about 20%.

In some embodiments, low deposition temperatures (e.g., less than about 400° C.) are responsible for weak Si—$NH_2$ bonds, which can be converted to Si—OH bonds once spacer material 130*a* is exposed to air during a vacuum break. Therefore, spacer material 130*a* deposited at a lower temperature is more susceptible to oxygen intake during an air exposure than material 130*a* deposited at higher temperatures (e.g., about 600° C.). For this reason, when the nitrogen concentration is high in spacer material 130*a*, the oxygen incorporation is low. Accordingly, when the nitrogen concentration is low in spacer material 130*a*, the oxygen incorporation is high. For example, a deposition temperature of about 600° C. can result in a nitrogen concentration between about 35% and about 45% and an oxygen concentration between about 10% and 15%. Accordingly, a deposition temperature of about 400° C. can result in a nitrogen concentration between about 15% and about 20% and an oxygen concertation between about 30% and about 40%. In some embodiments, the oxygen to nitrogen ratio in spacer material 130*a* ranges between about 0.25 and about 2—e.g., $0.25<O/N<2$.

In some embodiments, the nitrogen concentration in spacer material 130*a* modulates the dielectric constant of the layer. For example, a spacer layer with a high nitrogen concentration (e.g., deposited at a higher deposition temperature between about 500° C. and about 650° C.) has a high dielectric constant value between about 4.9 and about 5.2. Conversely, a spacer layer with a low nitrogen concentration (e.g., deposited at a lower deposition temperature between about 150° C. and about 350° C.) has a low dielectric constant value between about 3.7 and about 4.2. In some embodiments, the as-deposited dielectric constant of spacer material 130*a* ranges from about 3.7 to about 5.2 depending on the nitrogen concentration in spacer material 130*a* as discussed above.

In some embodiments, the mass density per unit volume ("density") of the as-deposited spacer material 130*a* ranges from about 1.5 g/cm$^3$ to about 2.2 g/cm$^3$ and is driven by the nitrogen concentration in spacer material 130*a*. For example, the density increases as the nitrogen concentration increases and decreases as the nitrogen concentration decreases. In some embodiments, the density of spacer material 130*a* is lower than the density of inner gate spacer 135*a*, which ranges from about 2.4 g/cm$^3$ to about 3.0 g/cm$^3$. In some embodiments, the density difference between spacer material 130*a* and inner gate spacer 135*a* provides an etching selectivity difference between the two during a subsequent etching process discussed below.

In some embodiments, the as-deposited spacer material 130*a* has a step coverage greater than about 95%. In some embodiments, the step coverage of spacer material 130*a* is defined as the ratio of the spacer layer thickness "inside" the spacer cavity to the spacer layer thickness "outside" the spacer cavity. For example, in referring to FIG. 9A, which is a magnified view of area 805 shown in FIG. 8, the step coverage of spacer material 130*a* is provided by the ratio of thickness B to thickness A (e.g., B/A). Therefore, thickness B is greater than about 0.95 times thickness A according to some embodiments. In some embodiments, B/A is greater than about 0.95 and less than or equal to about 1 (e.g., $0.95 \leq B/A \leq 1$). In some embodiments, thickness B is greater than about 3 nm. In some embodiments, a seam 900 is formed where portions of spacer material 130*a* covering sidewall surfaces of the spacer cavity meet. In some embodiments, the position and length of seam 900 along the x-direction depends on the horizontal sidewall profile of second NS layers 300*b* forming the spacer cavity. For example, for a "vertical" profile shown in FIG. 9A, thicknesses B and C are substantially equal. However, for a "tapered" profile shown in FIG. 9B, thickness B is greater than thickness C. Therefore, a vertical sidewall profile results in a seam 900 that is longer along the x-direction and positioned closer to first NS layer 300*a* as compared to a tapered profile, which results in a shorter seam 900 that is further way from first NS layer 300*a*. In some embodiments, and for the vertical profile shown in FIG. 9A, seam 900 may extend beyond the entrance of the spacer cavity and below the entrance of the spacer cavity when the spacer cavity profile is tapered as shown in FIG. 9B. In some embodiments, the width of seam 900 along the z-direction is less than about 1.5 nm for both profiles shown in FIGS. 9A and 9B unless the spacer cavity profile is re-entrant, which is not desirable.

Figure 9A:
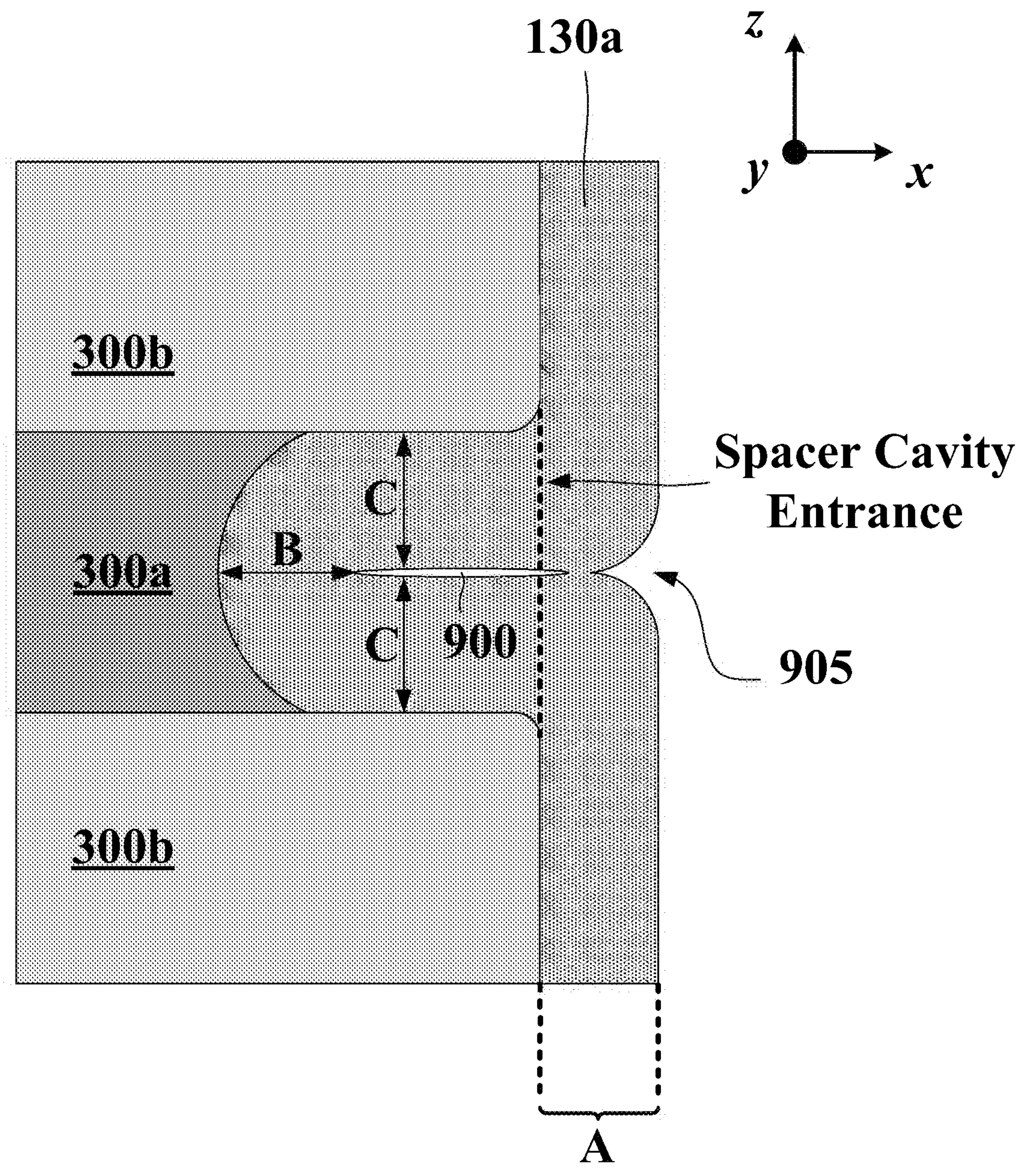
FIGS. 9A, 9B, 10, and 11 are magnified cross-sectional views of intermediate structures during the fabrication of spacer structures between gate structures and source/drain epitaxial structures of nanostructure transistors, in accordance with some embodiments.
Figure 9B:
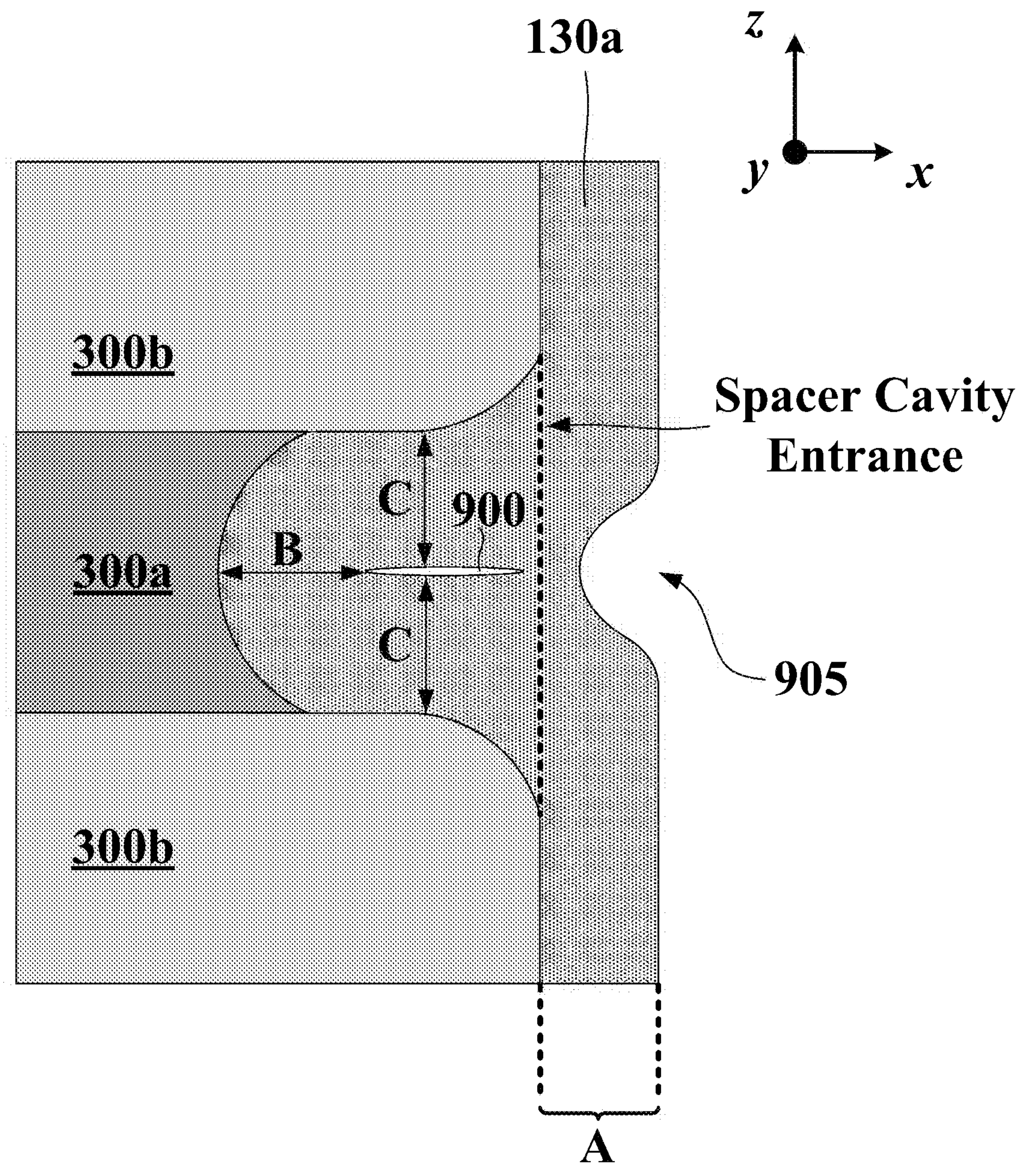

The spacer cavity profiles shown in FIGS. 9A and 9B may also effect the top surface topography of spacer material 130*a* over first NS layer 300*a*. For example, the vertical sidewall profile shown in FIG. 9A results in a less pronounced notch 905 than the tapered sidewall profile shown in FIG. 9B.

In referring to FIG. 2B, method 200 continues with operation 235 and the process of exposing spacer material 130*a* to a treatment (referred to as "post-deposition treatment"). In some embodiments, the post-deposition treatment removes residual gases from spacer material 130*a* and promotes Si-to-Si cross-linking (e.g., breaks hydrogen and amine terminated bonds). In some embodiments, the treatment increases the density of spacer material 130*a* between about 0.1 $g/cm^3$ and about 0.2 $g/cm^3$. For example, the density of spacer material 130*a* after the post-deposition treatment can be between about 1.7 $g/cm^3$ and about 2.4 $g/cm^3$.

In some embodiments, the post-deposition treatment does not substantially change the nitrogen and carbon concentration in spacer material 130*a*. For example, a change in the nitrogen and carbon concentration induced by the post-deposition treatment can be less than about 2%. In some embodiments, the post-deposition treatment does not substantially change the network of the silicon bonds within spacer material 130*a*. In some embodiments, a dielectric constant value between about 3.7 and about 4.2 is achieved via the removal of residual gas from spacer material 130*a*. In some embodiments, the post-deposition treatment can result in some oxygen incorporation in spacer material 130*a*. However, any oxygen incorporation during the post-deposition treatment does not increase the total oxygen concentration above about 40%.

In some embodiments, the post-treatment includes a thermal treatment, an ultra-violet (LTV) treatment, or a remote plasma treatment. In some embodiments, the thermal treatment does not include other sources of energy besides heat. For example, the thermal treatment does not include a plasma source or a LTV light source. During the thermal treatment, the spacer material 130*a* is subjected to an annealing temperature between about 550° C. and about 700° C. in the presence of argon, nitrogen, or a forming gas (e.g., a $N_2/H_2$ mixture) for about an hour or more. During the UV treatment, the spacer material 130*a* is exposed to LTV light while heated at a temperature between about 150° C. and 405° C. in the presence of helium, argon, or nitrogen. During the remote plasma treatment, the spacer material 130*a* is exposed to a helium, hydrogen, nitrogen, or argon plasma while heated a temperature between about room temperature (e.g., about 24° C.) and about 350° C. In some embodiments, remote plasma treatments at a lower temperature mitigate carbon loss from spacer material 130*a*.

In referring to FIG. 2B, method 200 continues with operation 240 and the process of etching spacer material 130*a* to form openings in spacer material 130*a*. In some embodiments, the openings are formed next to the etched edge portions of first NS layers 300*a*—e.g., in the spacer cavities. In some embodiments, the etching process includes a wet etching chemistry, such as DHF with a water ($H_2O$)/HF dilution ratio between about 100:1 and 500:1. In some embodiments, spacer material 130*a* is exposed to the wet etching chemistry between about 1 min and about 10 min. In some embodiments, dilution ratios closer to about 100:1 have higher etching rates than dilution ratios closer to about 500:1. Therefore, the dilution ratio can be selected based on thickness A of spacer material 130*a* and the stoichiometry of spacer material 130*a* to achieve the desired etching rate. In some embodiments, the DHF solution etches the spacer material 130*a* isotropically.

Figure 10:
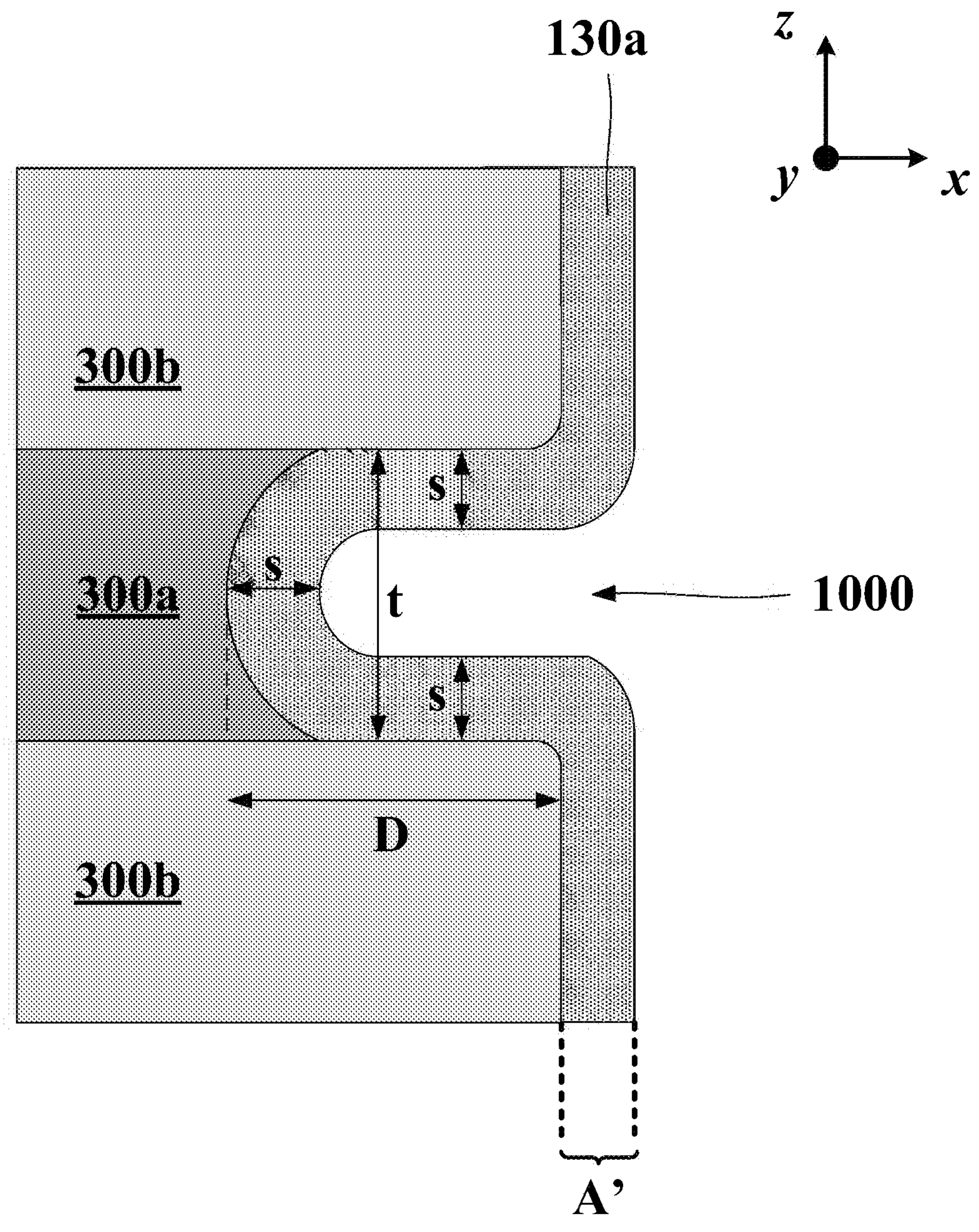

In some embodiments, the DHF solution enlarges notch 905 by progressively etching exposed surfaces of spacer material 130*a* within the spacer cavity. In some embodiments, during operation 240, notch 905 is enlarged to a uniform opening 1000 shown in FIG. 10. In some embodiments, after the etching process, thickness s of spacer material 130*a* within the spacer cavity is uniform and equal to or larger than about 2 nm (e.g., s≥2 nm). In some embodiments, spacing t is equal to the thickness of first NS layers 300*a* or the spacing between adjacent second NS layers 300*b* and ranges from about 6 nm to about 16 nm as discussed above. In some embodiments, opening 1000 has a width (t−2s) along the z-direction between about 2 nm (e.g., t−2 s≥2 nm) and about 14 nm (e.g., 2 nm≤(t−2s)≤14 nm). Accordingly, opening 1000 has a length along the x-direction equal to (D-s) as shown in FIG. 10. As discussed above, D ranges from about 5 nm to about 15 nm. During the formation of opening 1000 in operation 240, thickness A of spacer material 130*a* is reduced to thickness A' as shown in FIG. 10. In some embodiments, thickness A' is equal to or larger than s (e.g., A'≥s). In some embodiments, opening 1000 is formed shorter along the x-direction from the one shown in FIG. 10 if the sidewall profile of the spacer cavity is tapered as shown in FIG. 9B and not vertical as shown in FIGS. 9A and 10.

In referring to FIG. 2B, method 200 continues with operation 245 and the process of removing spacer material 130*a* from sidewall surfaces of fin structures 400 to form spacer structures 130. In some embodiments, the removal process includes a directional (e.g., anisotropic) dry etching process that preferentially etches spacer material 130*a* in a vertical direction (e.g., in the z-direction). In some embodiments, the dry etching process includes a fluorocarbon etching chemistry (e.g., $CH_xF_y$ and/or $CF_x$). In some embodiments, the etching chemistry includes other gases such as $N_2$, $O_2$, and carbon dioxide ($CO_2$).

Figure 11:
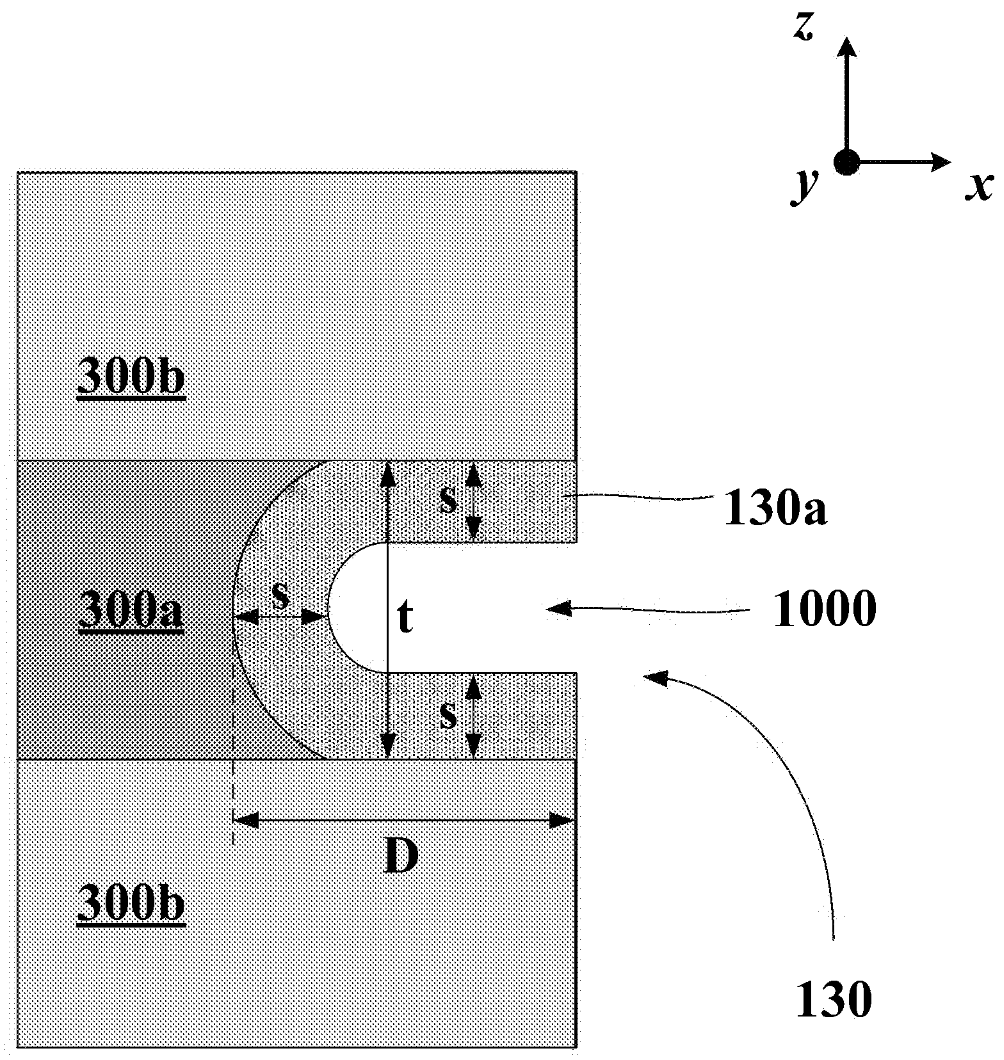
Figure 12:
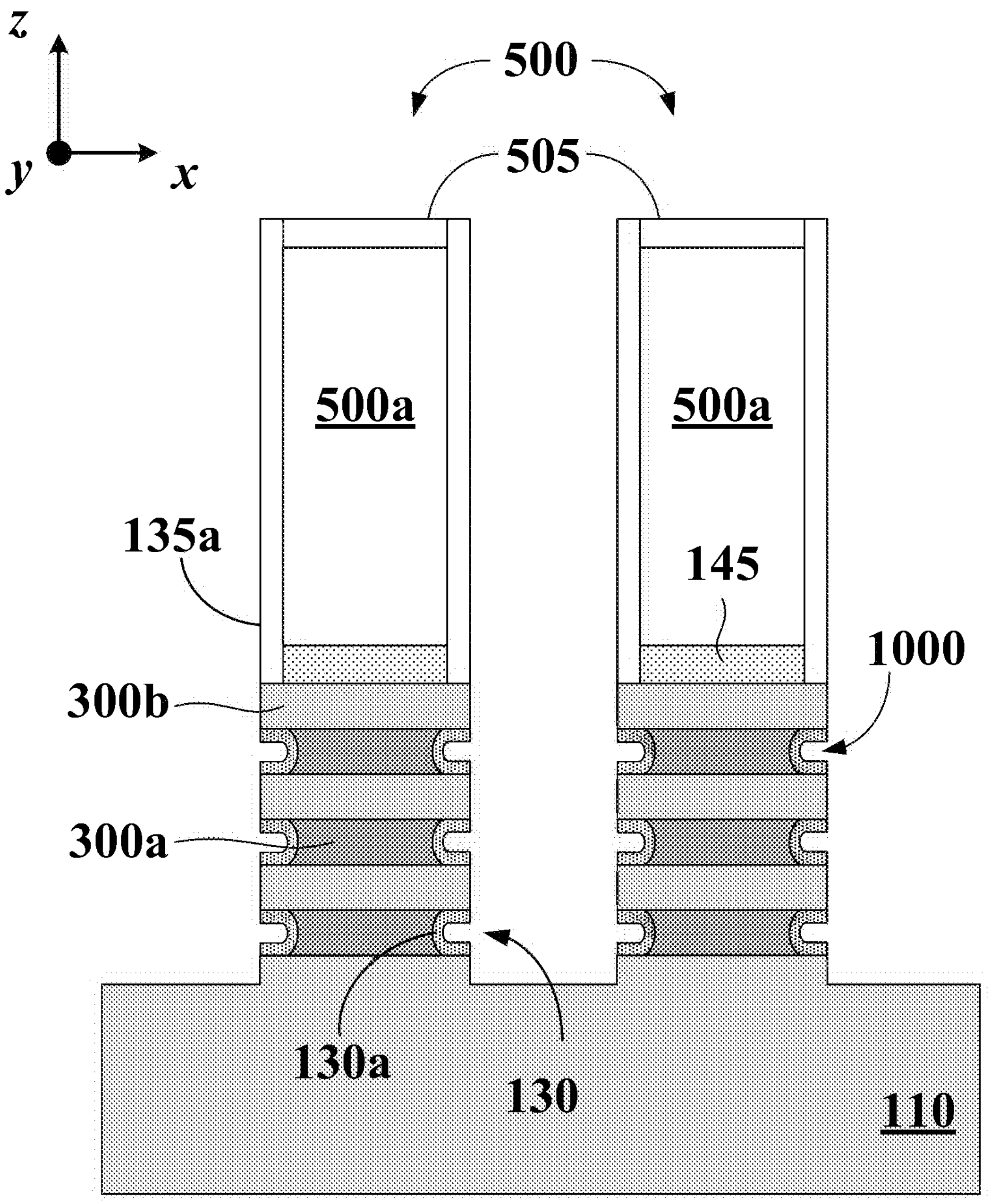
FIGS. 12 through 15 are cross-sectional views of intermediate structures during the fabrication of spacer structures between gate structures and source/drain epitaxial structures of nanostructure transistors, in accordance with some embodiments.

In some embodiments, the dry etching chemistry of operation 245 is selective towards the material of spacer material 130*a* as compared, for example, to the material of inner gate spacer 135*a*. In some embodiments, the difference in the etching selectivity between spacer material 130*a* and inner gate spacer 135*a* is attributed to the difference in their respective density values. For example, the lower-density spacer material 130*a*—which has a density between about 1.7 $g/cm^3$ and about 2.4 $g/cm^3$—is etched faster than the higher-density inner gate spacer 135*a*, which has a density between about 2.8 $g/cm^3$ and about 3.2 $g/cm^3$. Therefore, the lower density value of spacer material 130*a*, which is responsible for reducing the dielectric constant of spacer material 130*a*, can further provide etching selectivity advantages during the etching process of operation 245. In some embodiments, FIG. 11 shows the structure of FIG. 10 after operation 245 and the formation of spacer structure 130. In some embodiments, FIG. 12 shows the structure of FIG. 8 after operations 235, 240, and 245.

In some embodiments, the etching chemistry of operation 245 does not substantially etch inner gate spacer 135*a*, capping layers 505, second NS layers 300*b*, and substrate 110. By way of example and not limitation, the dry etching process of operation 245 can be timed, end-pointed, or a combination thereof. In some embodiments, opening 1000 formed in spacer material 130*a* reduces the dielectric constant of spacer structure 130 and is sealed in a subsequent operation to form air gaps 130*b* shown in FIG. 1.

Figure 13:
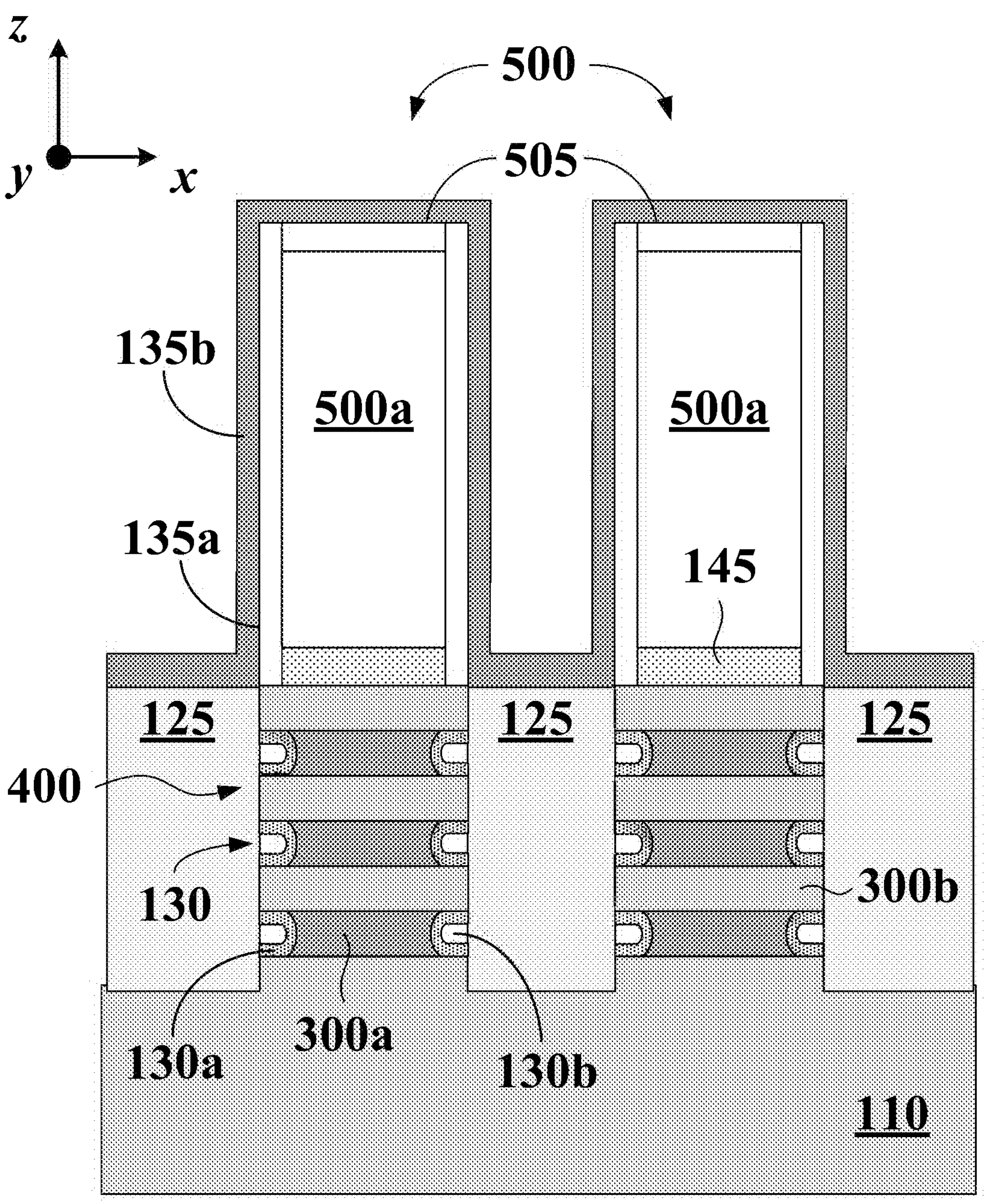

In referring to FIGS. 2B and 13, method 200 continues with operation 250 and the process of forming S/D epitaxial structures 125 abutting fin structures 400. By way of example and not limitation, S/D epitaxial structures 125 are formed directly on exposed top surfaces of substrate 110. By way of example and not limitation, S/D epitaxial structures 125 are grown with a CVD process similar to the one used to form first and second NS layers 300*a* and 300*b*. By way of example and not limitation, Si:P S/D epitaxial structures 125 (e.g., appropriate for n-type GAA FETs 100 and 105) can be grown using $SiH_4$. Phosphorous dopants can be introduced during growth with phosphine gas. In some embodiments, the phosphorous concentration can range from about $1\times10^{21}$ atoms/$cm^3$ to about $8\times10^{21}$ atoms/$cm^3$. The aforementioned doping concentration ranges are not limiting and other doping concentrations are within the spirit and the scope of this disclosure.

By way of example and not limitation, SiGe:B S/D epitaxial structures 125 (e.g., appropriate for p-type GAA FETs 100 and 105) can include two or more epitaxial layers grown in succession and having different Ge atomic percentages and B concentrations. For example, a first layer can have a Ge at. % that ranges from 0 to about 40%, and a B dopant concentration that ranges from about $5\times10^{19}$ atoms/$cm^3$ to about $1\times10^{21}$ atoms/$cm^3$. A second epitaxial layer can have a Ge at. % that ranges from about 20% to about 80% and a B dopant concentration that ranges from about $3\times10^{20}$ atoms/$cm^3$ to about $5\times10^{21}$ atoms/$cm^3$. Further, a third epitaxial layer can be a capping layer that has similar Ge at. % and B dopant concentrations with the first layer (e.g., 0 to about 40% for Ge and about $5\times10^{19}$ atoms/$cm^3$ to about $1\times10^{21}$ atoms/$cm^3$ for B dopant). The aforementioned doping concentrations are not limiting and other doping concentrations are within the spirit and the scope of this disclosure.

After the formation of S/D epitaxial structures 125 the "entrance" of opening 1000 shown in FIGS. 11 and 12 is sealed to form air gap 130*b* shown in FIG. 13. As discussed above, spacer structures 130 isolate first NS layers 300*a* from S/D epitaxial structures 125. At the same time, second NS layers 300*b* are in physical contact with S/D epitaxial structures 125.

In some embodiments, following the formation of S/D epitaxial structures 125, outer gate spacer 135*b* is formed to protect S/D epitaxial structures 125 from oxidation during the formation of ILD 140 shown in FIG. 1. By way of example and not limitation, outer gate spacer 135*b* includes an oxygen-free dielectric, such as SiN or SiCN. In some embodiments, the material of outer gate spacer 135*b* is blanket deposited on sacrificial gate structures 500 and S/D epitaxial structures 125 as shown in FIG. 13. In some embodiments, a single gate spacer material can be used for both inner and outer gate spacers. By way of example and not limitation, inner and outer gate spacers 135*a* and 135*b* can be deposited with a conformal process, such as a plasma-assisted CVD (PECVD) process and a plasma-assisted ALD (PEALD) process.

Figure 14:
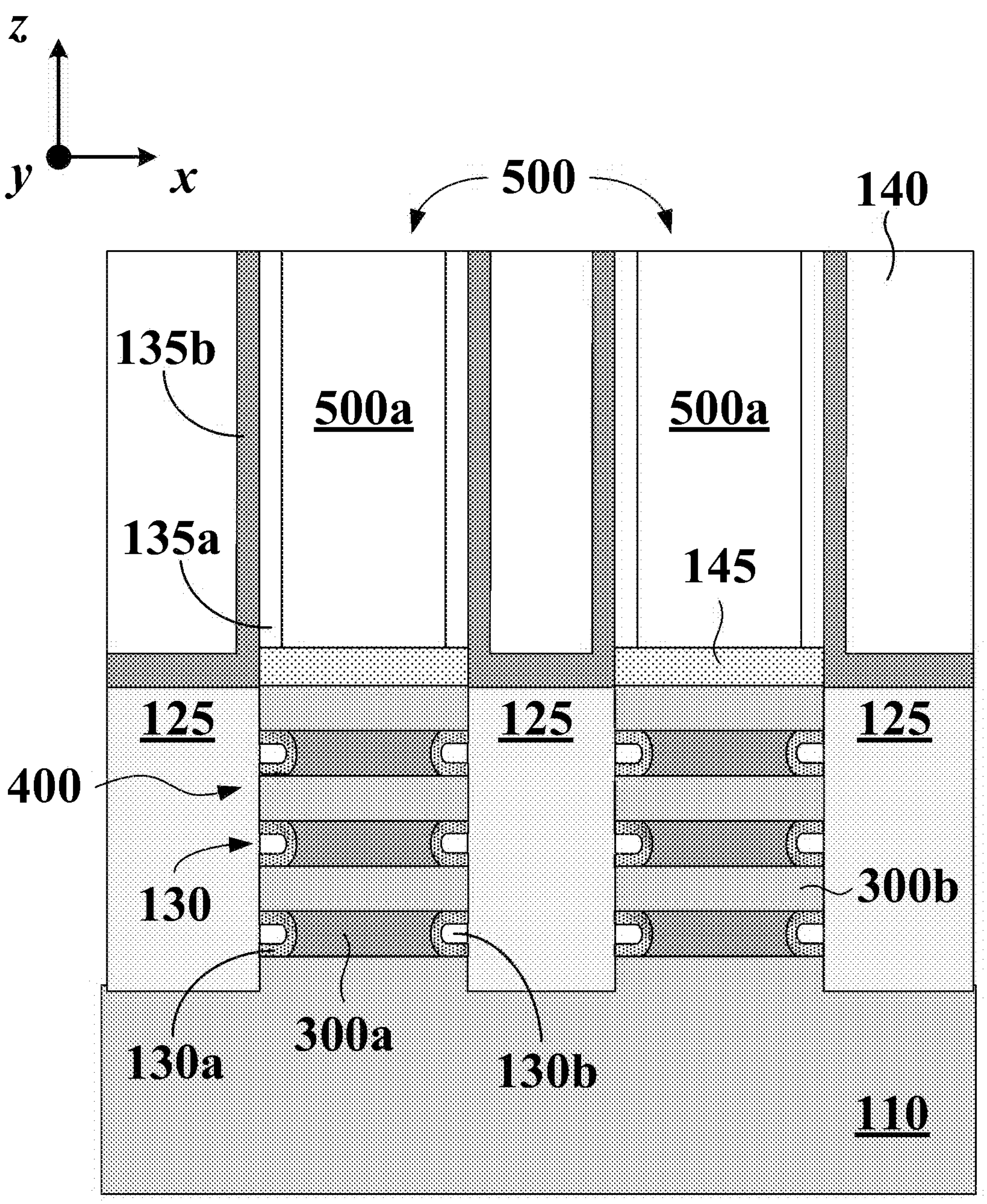

After the formation of outer gate spacer 135*b*, ILD 140 can be deposited and planarized so that top surfaces of ILD 140 are substantially coplanar with top surfaces of sacrificial gate electrodes 500*a* as shown in FIG. 14. In some embodiments, the planarization process of ILD 140 removes capping layer 505 so that the sacrificial gate electrodes 500*a* from sacrificial gate structures 500 are exposed. In some embodiments, ILD 140 includes a single dielectric or a stack of dielectrics. In some embodiments, ILD 140 is a silicon oxide based dielectric that includes other elements, such as nitrogen and/or hydrogen.

Figure 15:
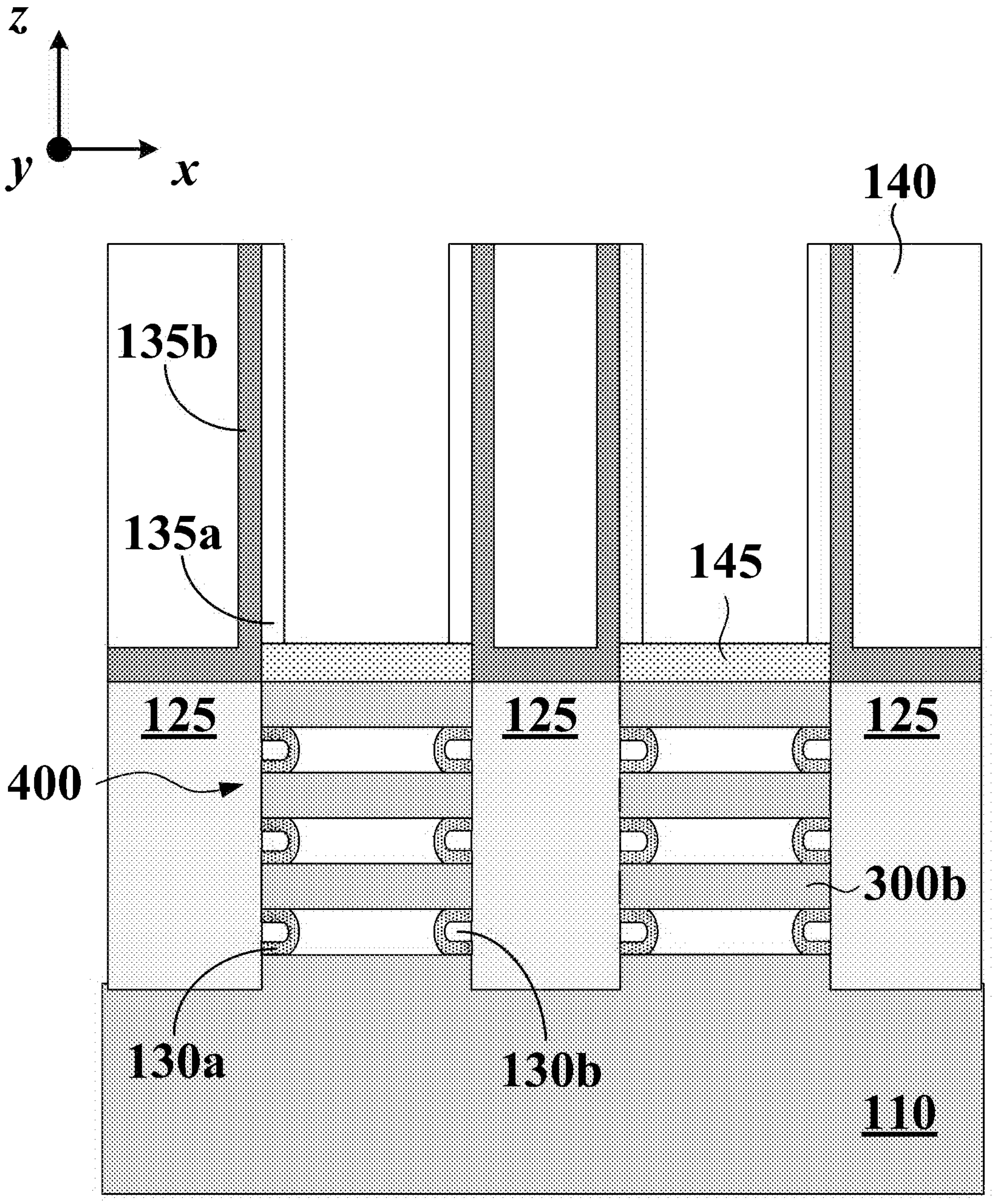

In referring to FIGS. 2B, method 200 continues with operation 255 and the process of removing sacrificial gate structures 500 and first nano-sheet layers 300*a* from fin structures 400. By way of example and not limitation, removal of sacrificial gate structures 500 and first nano-sheet layers 300*a* is achieved with one or more etching operations, which may include dry etching, wet etching, or combinations thereof. In some embodiments, first nano-sheet layers 300*a* are removed with a dry etching process selective to SiGe. For example, halogen-based chemistries exhibit higher etching selectivity towards Ge compared to Si. Therefore, halogen gases etch Ge-containing layers (e.g., first NS layers 300*a*) at a higher etching rate than substantially Ge-free layers (e.g., second NS layers 300*b*). In some embodiments, the halogen-based chemistry includes fluorine-based and/or chlorine-based gases. Alternatively, a wet etching chemistry with high selectivity towards SiGe can be used. By way of example and not limitation, a wet etching chemistry can include SPM or APM solutions. In some embodiments, the etching chemistry used in operation 255 does not remove second NS layers 300*b*, spacer structures 130 and inner/outer gate spacer structures 135*a*/135*b* as shown in FIG. 15.

Figure 16:
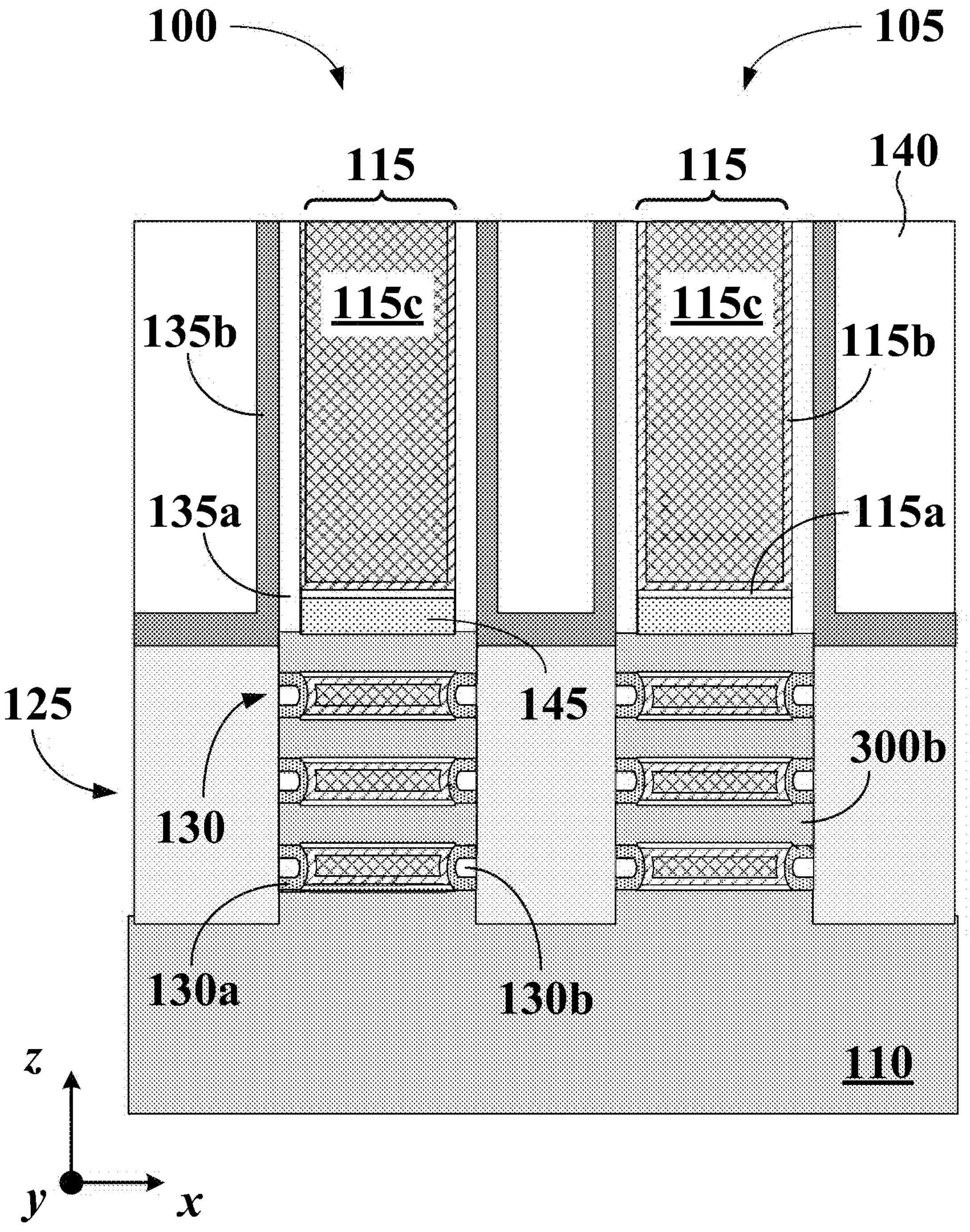
FIG. 16 is a cross-sectional view of nanostructure transistors, in accordance with some embodiments.

In referring to FIGS. 2B, method 200 continues with operation 260 and the process of forming metal gate structures (e.g., like the gate structures 115 shown in FIG. 1) to surround second nano-sheet layers 300*b* of fin structures 400. For example, the layers of gate structures 115 can be formed sequentially on the exposed surfaces of second NS layers 300*b* to form GAA-FETs 100 and 105 shown in FIG. 16. As discussed above, the metal gate structures (e.g., like the gate structures 115 shown in FIG. 16) are electrically isolated from S/D epitaxial structures 125 by spacer structures 130. FIG. 16 shows the structure of FIG. 15 after operation 260 and the formation of gate structures 115. In some embodiments, the GAA FETs shown in FIGS. 1 and 16 are identical. In some embodiments, air gaps 130*b* further reduce the parasitic capacitance formed between gate structures 115 and S/D epitaxial structures 125.

The embodiments described herein are directed to a method for the fabrication of low-dielectric constant spacer structures between S/D epitaxial structures and metal gate structures in GAAFETs to mitigate parasitic capacitances. In some embodiments, each spacer structure features an air gap or an air cavity, which provides further dielectric constant reduction. In some embodiments, the low dielectric constant spacer material is a SiN-based dielectric with a density between about 1.7 g/$cm^3$ and about 2.4 g/$cm^3$, and a dielectric constant between about 3.7 and 5.2. In some embodiments, oxygen is incorporated in the spacer material via air exposure and the oxygen-to-nitrogen ratio in the spacer material can be used to tune the dielectric constant of the resulting spacer structure. In some embodiments, the nitrogen concentration is controlled by the deposition temperature. In some embodiments, higher deposition temperatures (e.g., about 600° C. or higher) promote the nitrogen incorporation and suppress the oxygen incorporation, and lower deposition temperatures (e.g., about 400 or lower) suppress the nitrogen incorporation and promote the oxygen incorporation. In some embodiments, halogen or organic precursor can be used to deposit the spacer material. The organic precursors may or may not contain nitrogen. In some embodiments, the spacer material is treated with a post deposition process that includes a thermal-only treatment, an ultra-violet (LTV) treatment or a remote plasma treatment. In some embodiments, the air gap or the air cavity in the spacer structure is formed with a wet etching process that includes diluted hydrofluoric (DHF) acid. In some embodiments, the $H_2O$-to-HF ratio is between about 100:1 and 500:1 to provide an etching selectivity greater than about 100:1 between the spacer material and the surrounding layers.

In some embodiments, a structure includes a substrate and a pair of S/D epitaxial structures formed on the substrate. The structure further includes nanostructure elements between the pair of S/D epitaxial structures, where the nanostructure elements are separated from each other by layers of a gate structure and by spacer structures interposed between the layers of the gate structure and each S/D epitaxial structure of the pair of S/D epitaxial structures. In addition, each of the spacer structures comprises an air gap.

In some embodiments, a method includes forming a fin structure with alternating first and second nanostructure elements on a substrate and forming a sacrificial gate structure over the fin structure, where edge portions of the fin structure are not covered by the sacrificial gate structure. The method also includes removing the edge portions of the fin structure and etching edge portions of the first nanostructure elements in the fin structure to form cavities. Further, depositing a spacer material on the sacrificial gate structure and the fin structure to fill the cavities and removing a portion of the spacer material in the cavities to form an opening in the spacer material. In addition, the method includes forming S/D epitaxial structures on the substrate to abut the fin structure so that the S/D epitaxial structures are in contact with the second nanostructure elements and isolated from the first nanostructure elements by the spacer material. Further, sidewall portions of the S/D epitaxial structures seal the opening in the spacer material to form an air gap in the spacer material.

In some embodiments, a structure includes a pair of epitaxial structures on a substrate and vertically-stacked nanostructures between the pair of epitaxial structures, where the vertically-stacked nanostructures are in contact with the pair of epitaxial structures. The structure also includes a gate structure surrounding first portions of the vertically-stacked nanostructures between the pair of epitaxial structures. In addition, the structure includes spacer structures between second portions of the vertically-stacked nanostructures, where the spacer structures are interposed between the gate structure and sidewall portions of the pair of epitaxial structures. Further, the spacer structures include a spacer layer with a uniform thickness and an air gap surrounded by the spacer layer and the sidewall portions of the pair of epitaxial structures.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
- a stack of nanostructure elements on a substrate;
- an etch stop layer on a top surface of the stack of the nanostructure elements;
- a gate structure on the stack of nanostructures elements, wherein the gate structure surrounds the etch stop layer and each of the nanostructure elements in the stack of nanostructure elements;
- a source/drain (S/D) structure on the substrate and adjacent to the stack of nanostructures elements; and
- a spacer structure between the gate structure and the S/D structure, wherein the spacer structure comprises an air gap.

2. The structure of claim 1, wherein the nanostructure elements in the stack of nanostructure elements are nanosheet layers in contact with the S/D structure.

3. The structure of claim 1, wherein the air gap in the spacer structure abuts a sidewall portion of the S/D structure.

4. The structure of claim 1, wherein the air gap in the spacer structure is positioned about 3 nm from the gate structure.

5. The structure of claim 1, wherein the air gap has a width in a vertical dimension between about 2 nm and about 12 nm.

6. The structure of claim 1, wherein the spacer structure comprises a dielectric material with a dielectric constant between about 3.7 and about 5.2.

7. The structure of claim 1, wherein the spacer structure comprises a dielectric material with a mass density between about 1.7 g/cm$^3$ and about 2.4 g/cm$^3$.

8. A method, comprising:
- forming a stack of alternating first and second nanostructure elements on a substrate;
- forming a sacrificial gate structure over the stack of alternating first and second nanostructure elements;
- removing a portion of the stack of alternating first and second nanostructure elements outside of the sacrificial gate structure;
- laterally recessing the first nanostructure elements to form cavities;
- depositing a spacer material on the sacrificial gate structure and in the cavities;
- treating the spacer material with a post-deposition treatment;
- removing a portion of the spacer material in the cavities to form an opening in the spacer material; and
- forming source/drain (S/D) epitaxial structures on the substrate and in contact with the second nanostructure elements and the spacer material.

9. The method of claim 8, wherein depositing the spacer material comprises depositing the spacer material with a halogen precursor having a chemical formula $Si(CH_2)SiR_xCl_y$, and wherein R is hydrogen (—H) or a methyl group (—$CH_3$), x≥0, y≥1, and x+y=6.

10. The method of claim 8, wherein depositing the spacer material comprises depositing the spacer material with a halogen precursor having a chemical formula $Si(CH_2)_2SiR_xCl_y$, and wherein R is hydrogen (—H) or a methyl group (—$CH_3$), x≥0, y≥1, and x+y=4.

11. The method of claim 8, wherein depositing the spacer material comprises depositing the spacer material with a nitrogen-free organic precursor having a chemical formula $Si(CH_2)Si(CH_3)_xH_y$, and wherein x≥0, y≥2, and x+y=6.

12. The method of claim 8, wherein depositing the spacer material comprises depositing the spacer material with a nitrogen-containing organic precursor having a chemical formula $SiH_x(R_1)_y(R_2)_z$, and wherein $R_1$ is a methyl group (—$CH_3$), $R_2$ is $NH(CH_3)$ or $N(CH_3)_2$, x≥0, y≥1, z≥1, and x+y+z=4.

13. The method of claim 8, wherein depositing the spacer material comprises depositing the spacer material with an oxygen concentration and a nitrogen concentration, and wherein a dielectric constant of the spacer material increases in response to a ratio of the oxygen-to-nitrogen concentration increasing and decreases in response to the ratio of the oxygen-to-nitrogen concentration decreasing.

14. The method of claim 8, wherein depositing the spacer material comprises incorporating oxygen into the spacer material via air exposure.

15. The method of claim 8, wherein treating the spacer material with the post-deposition treatment comprises removing residual gases in the spacer material.

16. The method of claim 8, wherein removing the portion of the spacer material in the cavities comprises etching the spacer material with a wet etching chemistry comprising diluted hydrofluoric acid (DHF) with a dilution ratio between about 100:1 and about 500:1.

17. The method of claim 8, wherein the post-deposition treatment comprises a thermal-only treatment, an ultra-violet (UV) treatment, or a remote plasma treatment.

18. A structure, comprising:

a source/drain (S/D) structure on a substrate;

a stack of nanostructures on the substrate and adjacent to the S/D structure;

a gate structure surrounding central portions of the nano-structures in the stack of nanostructures;

a first gate spacer above the stack of nanostructures and on sidewall surfaces of the gate structure, wherein the first gate spacer has a first density;

a second gate spacer on sidewall surfaces of the first gate spacer and in contact with the S/D structure; and spacer structures between end portions of the nanostructures in the stack of nanostructures, wherein the spacer structures comprise:

a spacer layer having a second density different from the first density; and an air gap surrounded by the spacer layer and the S/D structure.

19. The structure of claim 18, wherein the air gap is spaced apart from the gate structure by the spacer layer.

20. The structure of claim 18, wherein the first density of the first gate spacer is greater than the second density of the spacer layer in the spacer structures, and wherein the second gate spacer comprises an oxygen-free dielectric material.

* * * * *